(12) United States Patent
Kamoshida

(10) Patent No.: US 7,439,782 B2
(45) Date of Patent: Oct. 21, 2008

(54) SEMICONDUCTOR INTEGRATED CIRCUIT DEVICE WITH POWER-ON RESET CIRCUIT FOR DETECTING THE OPERATING STATE OF AN ANALOG CIRCUIT

(75) Inventor: Masahiro Kamoshida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

(21) Appl. No.: 11/475,229

(22) Filed: Jun. 27, 2006

(65) Prior Publication Data

US 2007/0001516 A1 Jan. 4, 2007

(30) Foreign Application Priority Data

Jun. 29, 2005 (JP) ............................. 2005-189951

(51) Int. Cl.
*H03L 7/00* (2006.01)
(52) U.S. Cl. ..................................... 327/143; 327/198
(58) Field of Classification Search ................. 327/143, 327/144, 198, 77
See application file for complete search history.

(56) References Cited

U.S. PATENT DOCUMENTS 6,087,890 A * 7/2000 Kim ........................... 327/526
6,642,757 B2 11/2003 Ikehashi et al.
6,901,012 B2 5/2005 Ikehashi et al.
2005/0140405 A1 * 6/2005 Do et al. ..................... 327/143

FOREIGN PATENT DOCUMENTS

JP 2002-100974 4/2002

* cited by examiner

*Primary Examiner*—Tuan T. Lam
*Assistant Examiner*—Daniel Rojas
(74) *Attorney, Agent, or Firm*—Oblon, Spivak, McClelland, Maier & Neustadt, P.C.

(57) ABSTRACT

A semiconductor integrated circuit device operates using a first power supply and a second power supply differing from the first power supply in voltage. The semiconductor integrated circuit device includes a first detecting circuit which detects that the first power supply has exceeded a specific voltage, a second detecting circuit which detects that the second power supply has exceeded a specific voltage, and a check circuit which checks the operating state of an analog circuit carrying out an analog operation using the first power supply and outputs a control signal indicating whether the analog circuit is operating properly. The detecting level of the first detecting circuit is determined on the basis of the control signal. A power-on reset signal is output according to the result of the detection at the first and second detecting circuits.

9 Claims, 27 Drawing Sheets

Power-on reset circuit

Power-on reset circuit

Level shifter

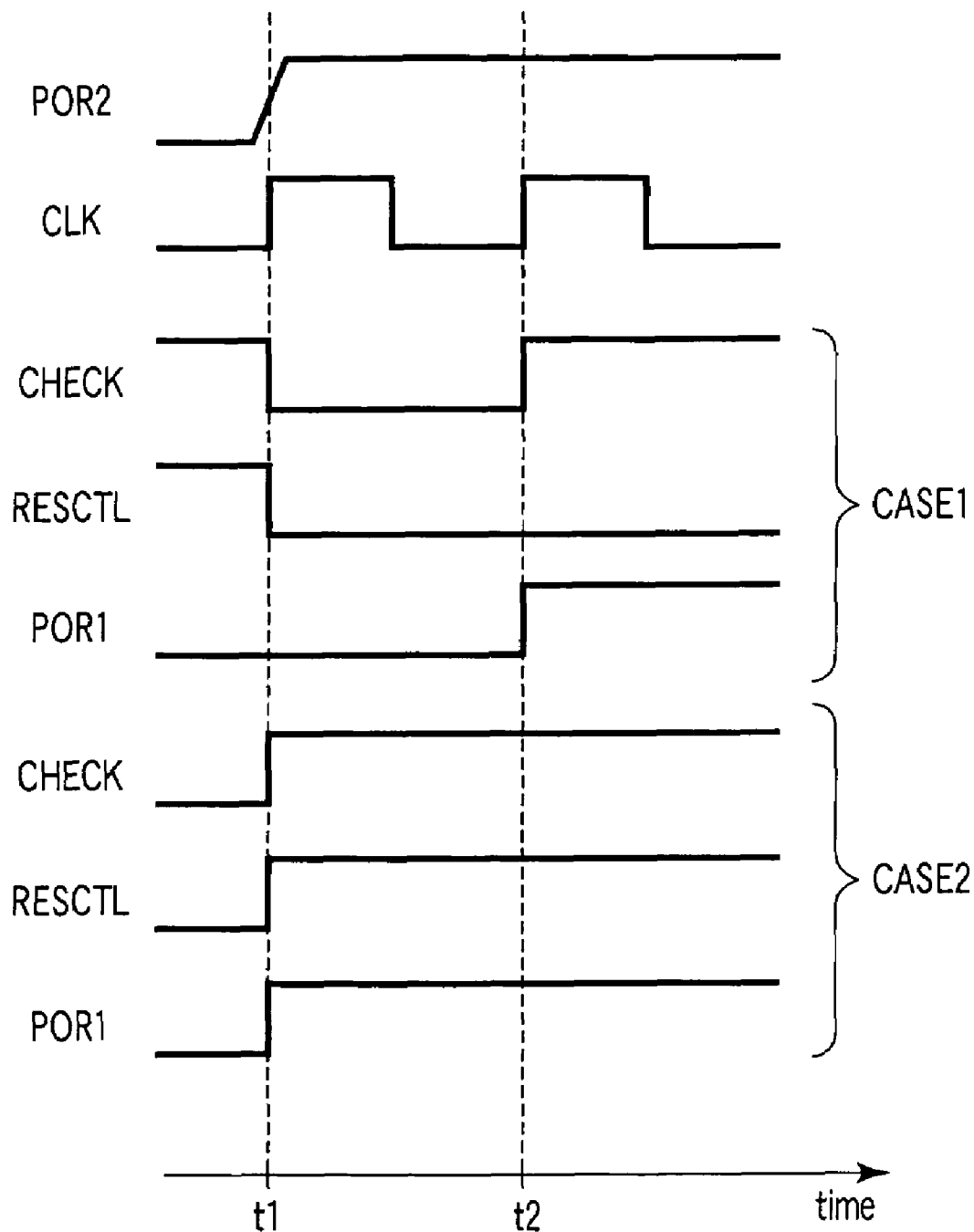
F I G. 7

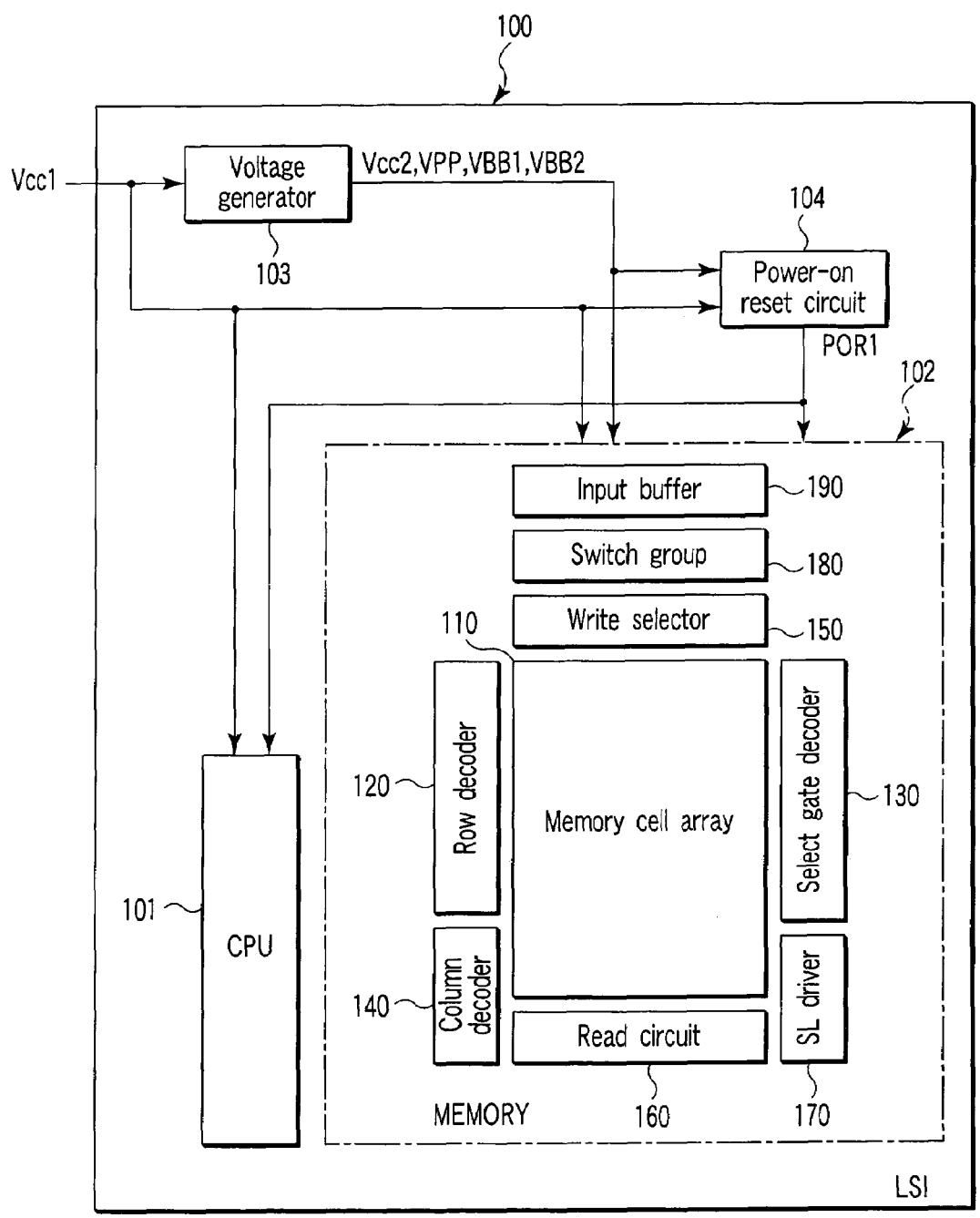
F I G. 13

FIG. 22      WRITE OPERATION

READ OPERATION

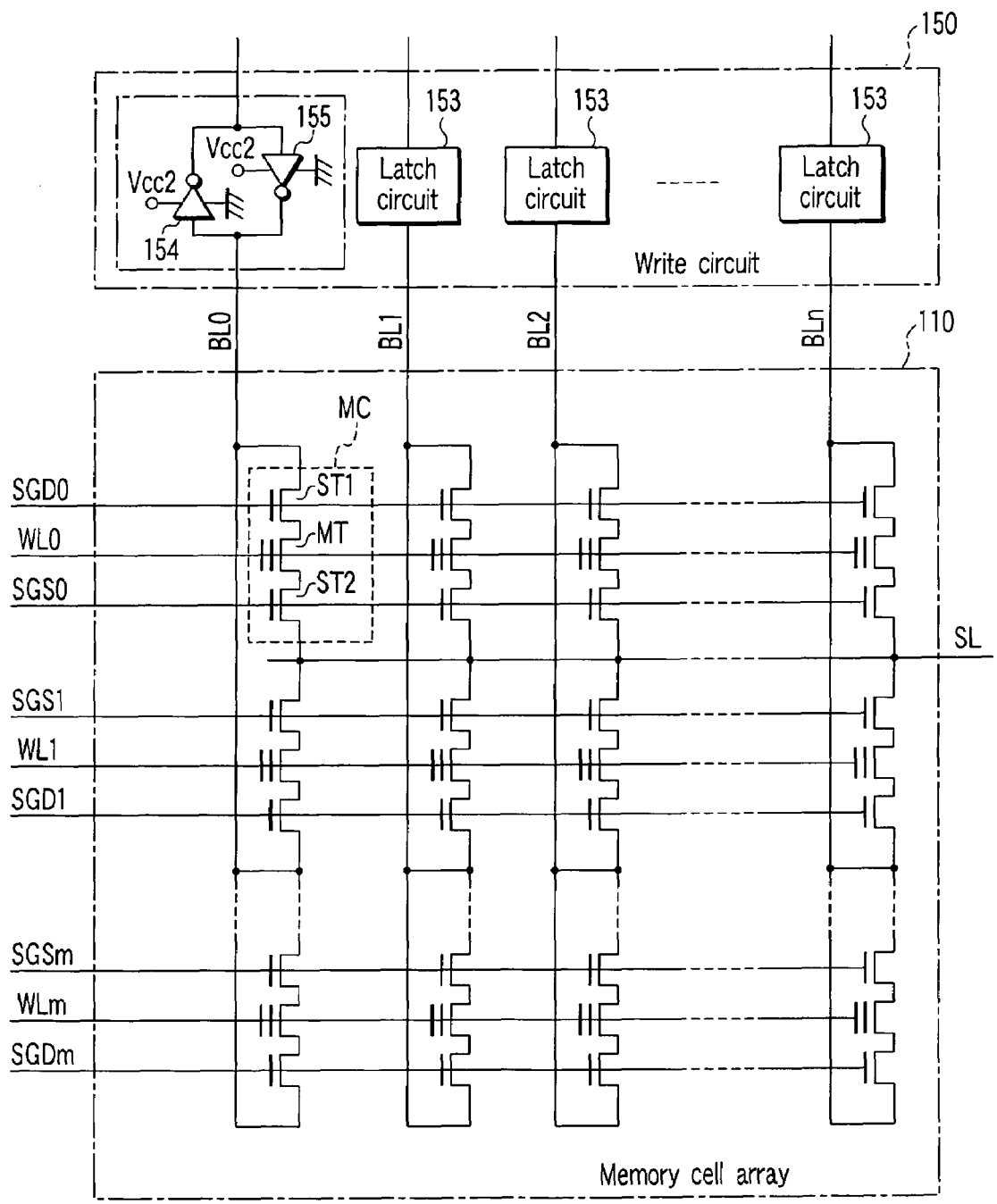
F I G. 25

SEMICONDUCTOR INTEGRATED CIRCUIT DEVICE WITH POWER-ON RESET CIRCUIT FOR DETECTING THE OPERATING STATE OF AN ANALOG CIRCUIT

CROSS-REFERENCE TO RELATED APPLICATIONS

This application is based upon and claims the benefit of priority from prior Japanese Patent Application No. 2005-189951, filed Jun. 29, 2005, the entire contents of which are incorporated herein by reference.

BACKGROUND OF THE INVENTION

1. Field of the Invention

This invention relates to a semiconductor integrated circuit device. More particularly, this invention relates to a semiconductor integrated circuit device which has a semiconductor memory device and a logic circuit formed on a single semiconductor substrate.

2. Description of the Related Art

In the field of a semiconductor integrated circuit (LSI) which has a semiconductor memory and a logic circuit formed on a single substrate, the need for a rewritable flash memory as a semiconductor memory has recently being increasing.

In a combined flash memory/logic LSI, a low-voltage power supply is used in the logic circuit to meet low-power requirements and the like. In the flash memory, a high-voltage power supply necessary to write and erase the data is used. Since the power supply of the flash memory differs from that of the logic circuit, it is necessary to detect the voltage levels of a plurality of power supplies at the time when the power supply of the LSI is turned on. A circuit for such a purpose has been proposed in, for example, Jpn. Pat. Appln. KOKAI Publication No. 2002-100974.

However, even if a conventional detecting circuit has sensed that the power supply has reached a sufficient voltage level for the operation of the logic circuit, the voltage level might not be sufficient for the operation of the analog circuit. In such a case, the logic circuit operates properly, but the analog circuit operates erroneously.

BRIEF SUMMARY OF THE INVENTION

A semiconductor integrated circuit device, which operates using a first power supply and a second power supply differing from the first power supply in voltage, according to an aspect of the present invention, includes:

a first detecting circuit which detects that the first power supply has exceeded a specific voltage;

a second detecting circuit which detects that the second power supply has exceeded a specific voltage; and a check circuit which checks the operating state of an analog circuit which carries out an analog operation using the first power supply and outputs a control signal indicating whether the analog circuit is operating properly, a detecting level of the first detecting circuit being determined on the basis of the control signal and a power-on reset signal being output according to the result of the detection at the first and second detecting circuits, the power-on reset signal indicating that the first and second power supplies have reached a specific value.

BRIEF DESCRIPTION OF THE SEVERAL VIEWS OF THE DRAWING

FIG. 7 is a timing chart of various signals in the voltage detecting method in the LSI of the first embodiment;

FIG. 13 is a block diagram of an LSI according to a fifth embodiment of the present invention;

FIG. 25 is a circuit diagram of the write circuit and memory cell array of a 3Tr-NAND flash memory included in an LSI according to a sixth embodiment of the present invention;

DETAILED DESCRIPTION OF THE INVENTION

Figure 1:
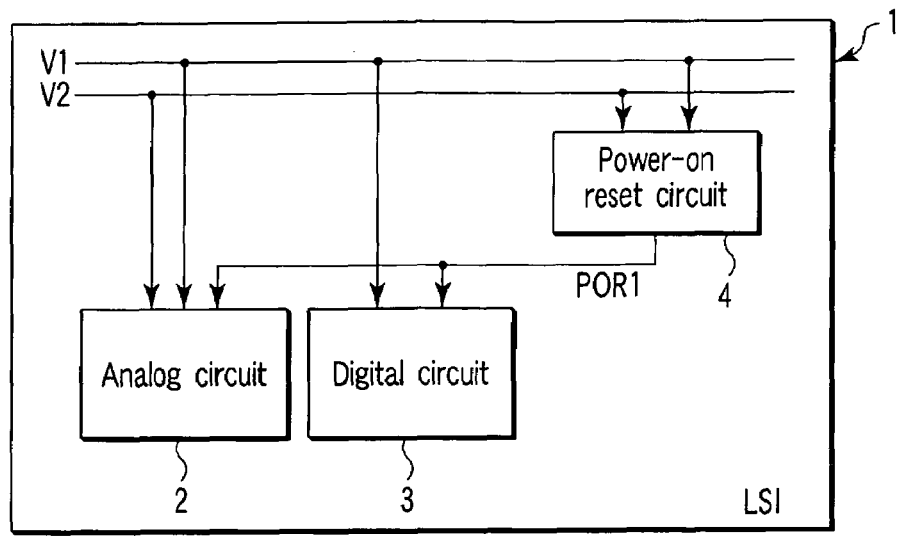
FIG. 1 is a block diagram of an LSI according to a first embodiment of the present invention.

Referring to FIG. 1, a semiconductor integrated circuit device according to a first embodiment of the present invention will be explained. FIG. 1 is a block diagram of an LSI according to the first embodiment.

As shown in FIG. 1, an LSI 1 of the first embodiment comprises an analog circuit 2, a digital circuit 3, and a power-on reset circuit 4. The analog circuit 2, which carries out an analog operation, uses a first power supply V1 (e.g., 1.5 V) and a second power supply V2 (|V2|>|V1|) as power supply voltages. The digital circuit 3, which carries out a digital operation, uses the first power supply V1 as a power supply voltage. The power-on reset circuit 4 senses whether each of the first and second power supplies V1 and V2 has reached a specific value. When they have reached the respective specific values, the power-on reset circuit 4 asserts a power-on reset signal POR1 (or sets a power-on reset signal POR1 to a high (H) level). When the power-on reset signal POR1 is asserted, the analog circuit 2 and digital circuit 3 go into an operable state.

Figure 2:
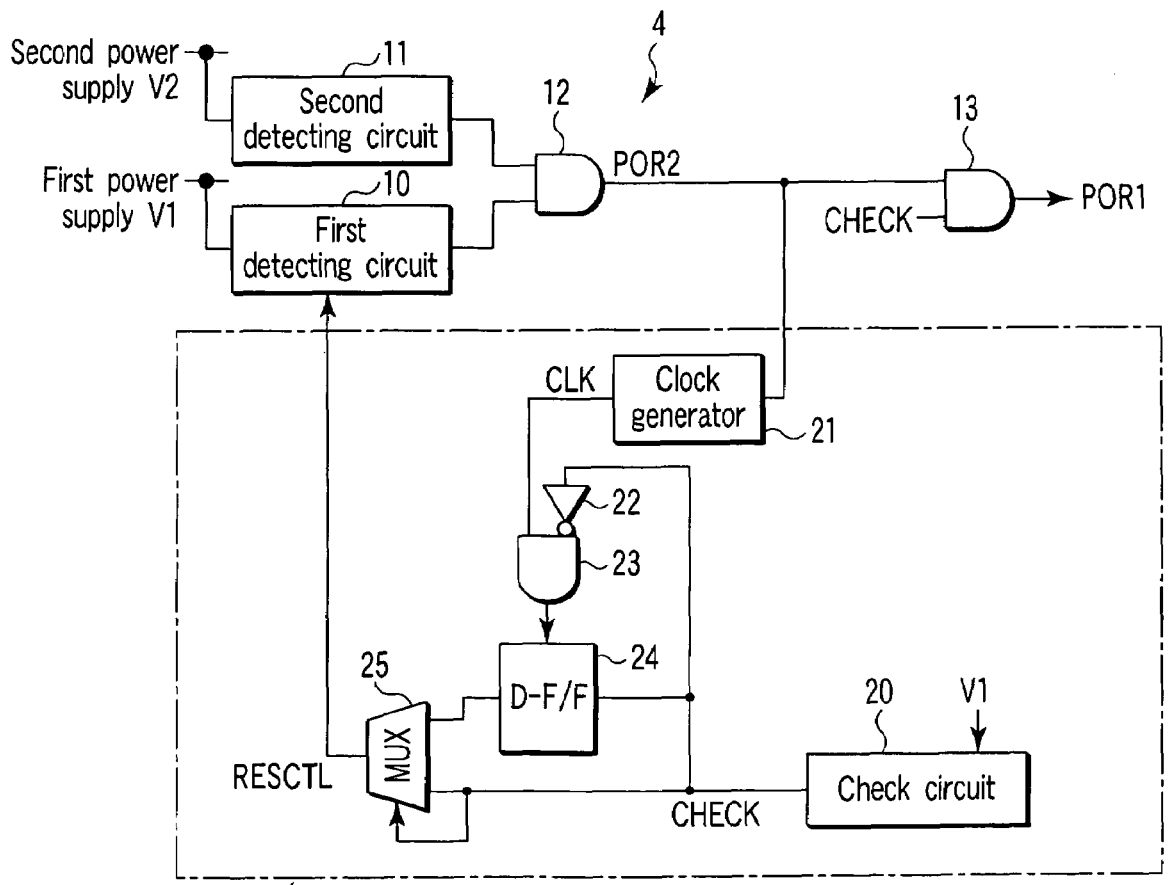
FIG. 2 is a circuit diagram of a power-on reset circuit included in the LSI of the first embodiment.

FIG. 2 is a circuit diagram of the power-on reset circuit 4. As shown in FIG. 2, the power-on reset circuit 4 includes a first detecting circuit 10, a second detecting circuit 11, AND gates 12, 13, and a control circuit 14. The first detecting circuit 10 detects whether the first power supply V1 has reached a specific value. If the first power supply V1 has reached the specific value, the first detecting circuit 10 outputs a high (H) level. The detecting level of the first detecting circuit 10 is controlled by the control circuit 10. The second detecting circuit 11 detects whether the second power supply V2 has reached a specific value. If the second power supply V2 has reached the specific value, the second detecting circuit 11 outputs a high (H) level. The AND gate 12 performs the AND operation of the output of the first detecting circuit 10 and the output of the second detecting circuit 11 and outputs the result as a power-on reset signal POR2. The AND gate 13 performs the AND operation of the power-on reset signal POR2 and a detect signal CHECK and outputs the result as a power-on reset signal POR1. The detect signal CHECK will be explained below. The control circuit 14 controls the detecting level of the first detecting circuit 10 according to the power-on reset signal POR2.

The control circuit 14 includes a check circuit 20, a clock generator 21, an inverter 22, an AND gate 23, a D flip-flop 24, and a multiplexer 25. The check circuit 20, which includes an internal analog circuit that operates on the first power supply V1, outputs a detect signal CHECK. Then, the check circuit 20 detects whether the internal analog circuit is operating properly. If the internal analog circuit is operating properly, the check circuit 20 asserts the detect signal CHECK (or sets the detect signal to the high (H) level). The clock generator 21 generates a clock CLK during the period when the power-on reset signal POR2 is at the high (H) level. The inverter 22 inverts the detect signal CHECK. The AND gate 23 performs the AND operation of the output of the inverter 22 and the clock CLK. When the output of the AND gate 23 is at the high (H) level, the D flip-flop 24 latches the detect signal CHECK. The multiplexer 25 selects either the data stored in the D flip-flop 24 and the detect signal CHECK output from the check circuit 20 and outputs the selected signal as a level control signal RESCTL. Specifically, if the detect signal CHECK is at the low (L) level, the multiplexer 25 selects the detect signal CHECK output from the check circuit 20. If the detect signal CHECK is at the high (H) level, the multiplexer 25 selects the data stored in the D flip-flop 24. Immediately after the power supply is turned on, the high (H) level is latched as the initial value in the D flip-flop.

Figure 3:
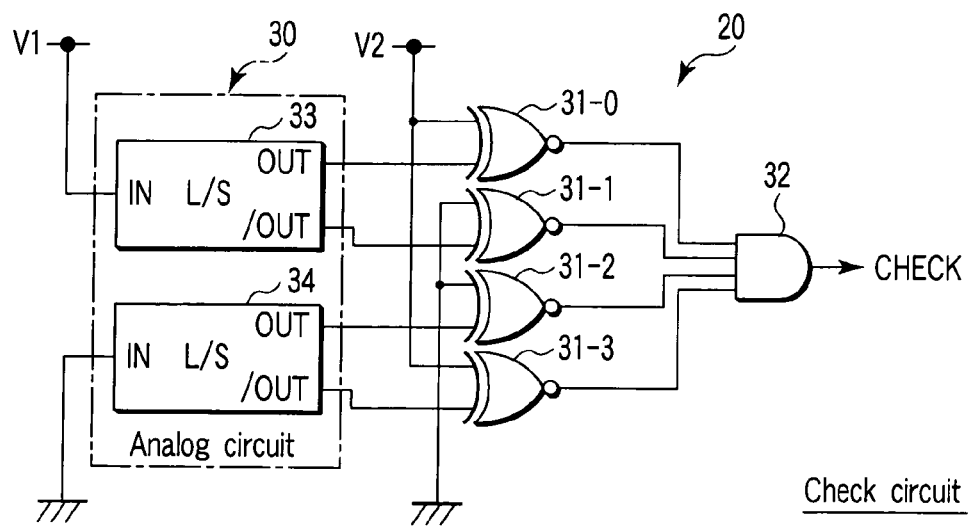
FIG. 3 is a circuit diagram of a check circuit included in the LSI of the first embodiment.

FIG. 3 is a circuit diagram of an example of the check circuit 20. As shown in FIG. 3, the check circuit 20 includes an analog circuit 30, EXNOR gates 31-0 to 31-3, and an AND gate 32. The analog circuit 30 includes, for example, two level shifters 33, 34. The first power supply V1 is input to the level shifter 33. The ground potential is input to the level shifter 34. The EXNOR gate 31-0 performs the EXNOR operation of the output OUT of the level shifter 33 and the second power supply V2. The EXNOR gate 31-1 performs the EXNOR operation of the inverted output /OUT of the level shifter 33 and the ground potential. The EXNOR gate 31-2 performs the EXNOR operation of the output OUT of the level shifter 34 and the ground potential. The EXNOR gate 31-3 performs the EXNOR operation of the inverted output /OUT of the level shifter 34 and the second power supply V2. The AND gate 32 performs the AND operation of the outputs of the EXNOR gates 31-0 to 31-3 and outputs the result of the AND operation as a detect signal CHECK.

Figure 4:
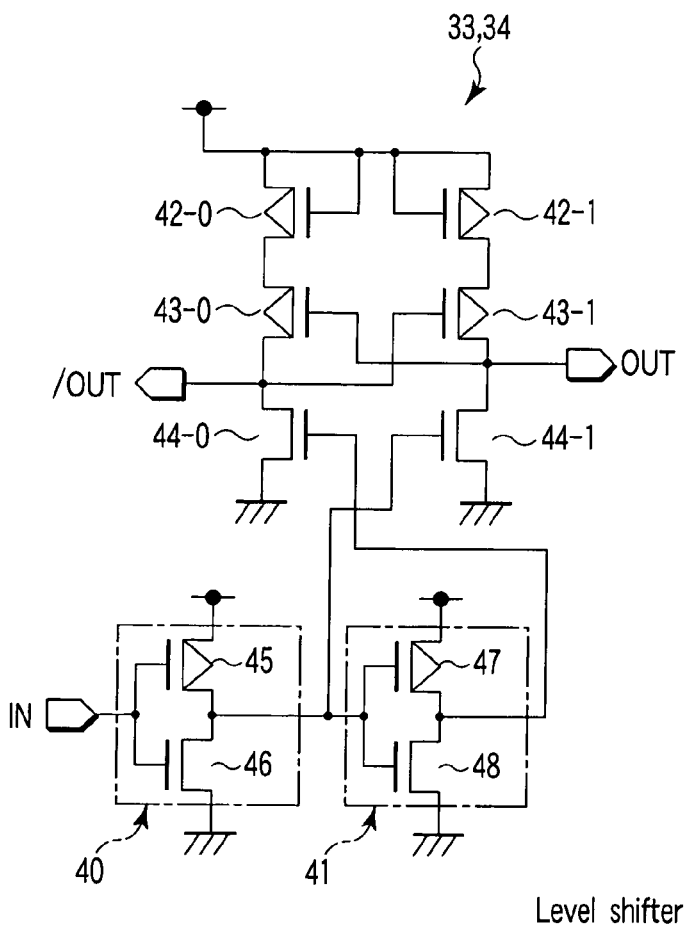
FIG. 4 is a circuit diagram of a level shifter included in the LSI of the first embodiment.

FIG. 4 is a circuit diagram of an example of each of the level shifters 33, 34. As shown in FIG. 4, each of the level shifters 33, 34 includes inverters 40, 41, p-channel MOS transistors 42-0, 42-1, 43-0, 43-1, and n-channel MOS transistors 44-0, 44-1. The inverter 40 includes a p-channel MOS transistor 45 and an n-channel MOS transistor 46. The p-channel MOS transistor 45 has its source connected to the power supply potential, its drain connected to the drain of the n-channel MOS transistor 46, and its gate connected to the gate of the n-channel MOS transistor 46. The source of the n-channel MOS transistor 46 is connected to the ground potential. The gates of the transistor 45, 46 are connected to the input node of the inverter 40 and make an input terminal IN of each of the level shifters 33, 34. The junction node of the drain of the p-channel MOS transistor 45 and the drain of the n-channel MOS transistor 46 makes the output node of the inverter 40. The inverter 41 includes a p-channel MOS transistor 47 and an n-channel MOS transistor 48. The p-channel MOS transistor 47 has its source connected to the power supply potential, its drain connected to the drain of the n-channel MOS transistor 48, and its gate connected to the gate of the n-channel MOS transistor 48. The source of the n-channel MOS transistor 48 is connected to the ground potential. The gates of the transistor 47, 48 are connected to the input node of the inverter 41 and make an input terminal IN of each of the level shifters 33, 34. The junction node of the drain of the p-channel MOS transistor 47 and the drain of the n-channel MOS transistor 48 makes the output node of the inverter 41.

The sources and gates of the p-channel MOS transistors 42-0, 42-1 are connected to the power supply potential. The p-channel MOS transistors 42-0, 42-1 have their drains connected to the sources of the p-channel MOS transistors 43-0, 43-1, respectively. The drains of the p-channel MOS transistors 43-0, 43-1 are connected to the drains of the n-channel MOS transistors 44-0, 44-1, respectively, and further connected to the gates of the p-channel MOS transistors 43-1, 43-0, respectively. The n-channel MOS transistors 44-0, 44-1 have their sources connected to the ground potential and their gates connected to the output nodes of the inverters 41, 40, respectively. The junction node of the drain of the p-channel MOS transistor 43-1, the gate of the p-channel MOS transistor 43-0, and the drain of the n-channel MOS transistor 44-1 makes the output node OUT of each of the level shifters 33, 34. The junction node of the drain of the p-channel MOS transistor 43-0, the gate of the p-channel MOS transistor 43-1, and the drain of the n-channel MOS transistor 44-0 makes the inverted output node /OUT of each of the level shifters 33, 34.

With the above configuration, when the first power supply V1 is input to the level shifter 33, the power supply potential (high (H) level) is output to the output node OUT via the current paths of the transistors 42-1, 43-1, whereas the ground potential (low (L) level) is output to the inverted output node OUT via the current path of the transistor 44-0. When the ground potential is input to the level shifter 34, the power supply potential (high (H) level) is output to the inverted output node /OUT via the current paths of the transistors 42-1, 43-1, whereas the ground potential (low (L) level) is output to the output node OUT via the current path of the transistor 44-0.

Figure 5:
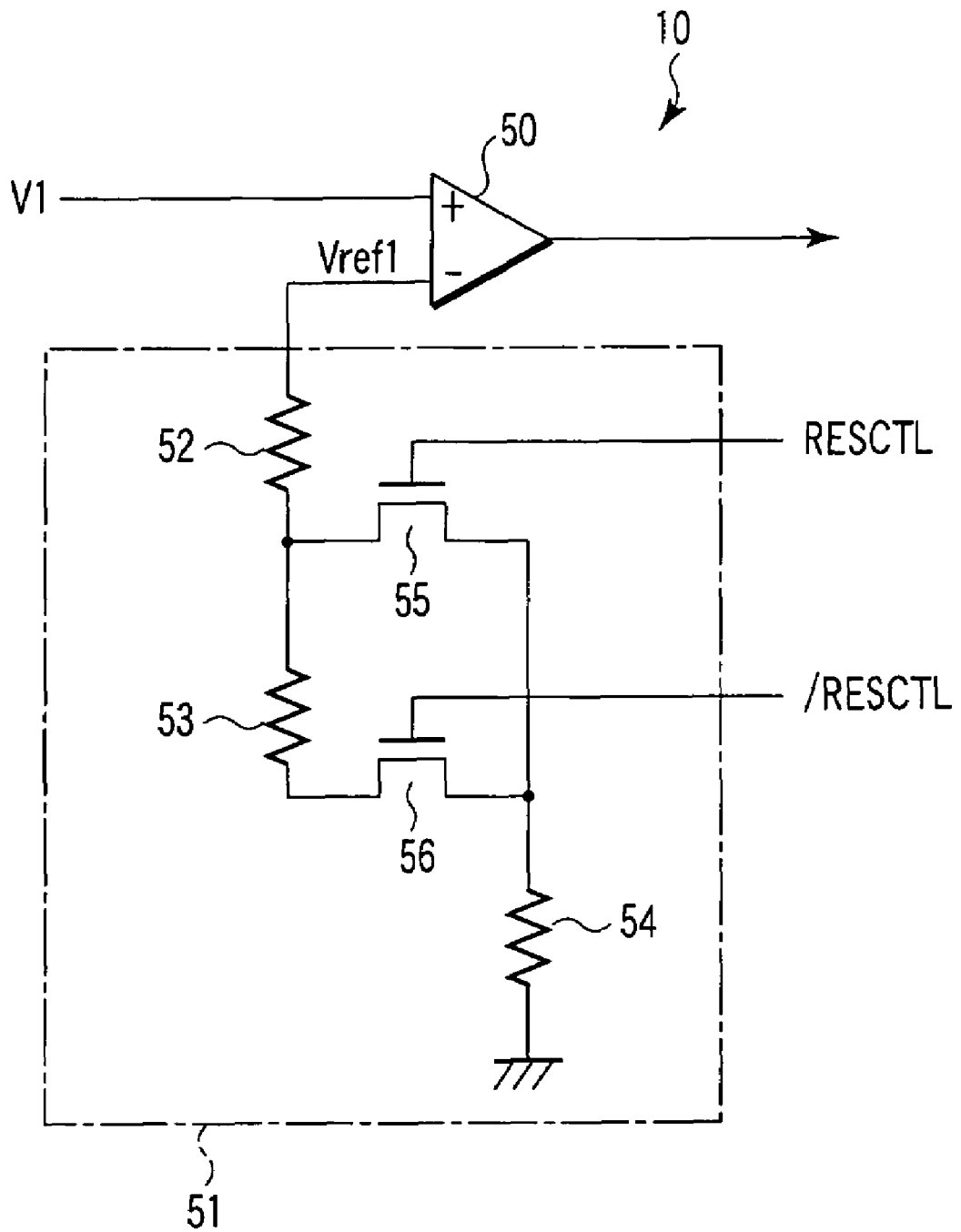
FIG. 5 is a circuit diagram of a first detecting circuit included in the LSI of the first embodiment.

FIG. 5 is a circuit diagram of an example of the first detecting circuit in FIG. 2. As shown in FIG. 5, the first detecting circuit 10 includes a comparator 50 and a variable resistive element 51. The variable resistive element 51 includes resistive elements 52 to 54 and n-channel MOS transistors 55, 56. The resistive elements 52 to 54 are connected in series. One end of the resistive element 52 is connected to the inverted input terminal (−) of the comparator 50. One end of the resistive element 54 is grounded. A MOS transistor 55 is provided between the resistive element 52 and the resistive element 54. Specifically, the drain of the MOS transistor 55 is connected to the junction node of the other end of the resistive element 52 and one end of the resistive element 53. The source of the MOS transistor 55 is connected to the other end of the resistive element 54. A MOS transistor 56 is provided between the resistive element 53 and the resistive element 54. Specifically, the drain of the MOS transistor 56 is connected to one end of the resistive element 53. The source of the MOS transistor 56 is connected to the other end of the resistive element 54. A level control signal RESCTL and an inverted level control signal /RESCTL are input to the gate of the MOS transistor 55 and that of the MOS transistor 56, respectively.

The first power supply V1 is connected to the normal input terminal (+) of the comparator 50. The comparator 50 compares the power supply voltage V1 with a voltage Vref1 generated at the variable resistive element 51. If V1>Vref1, the comparator 50 outputs a high (H) level.

The second detecting circuit 11 also includes a comparator, which compares the second power supply V2 with a specific voltage Vref2. If the second power supply V2 has exceeded the specific voltage, the second detecting circuit 11 outputs a high (H) level.

Figure 6:
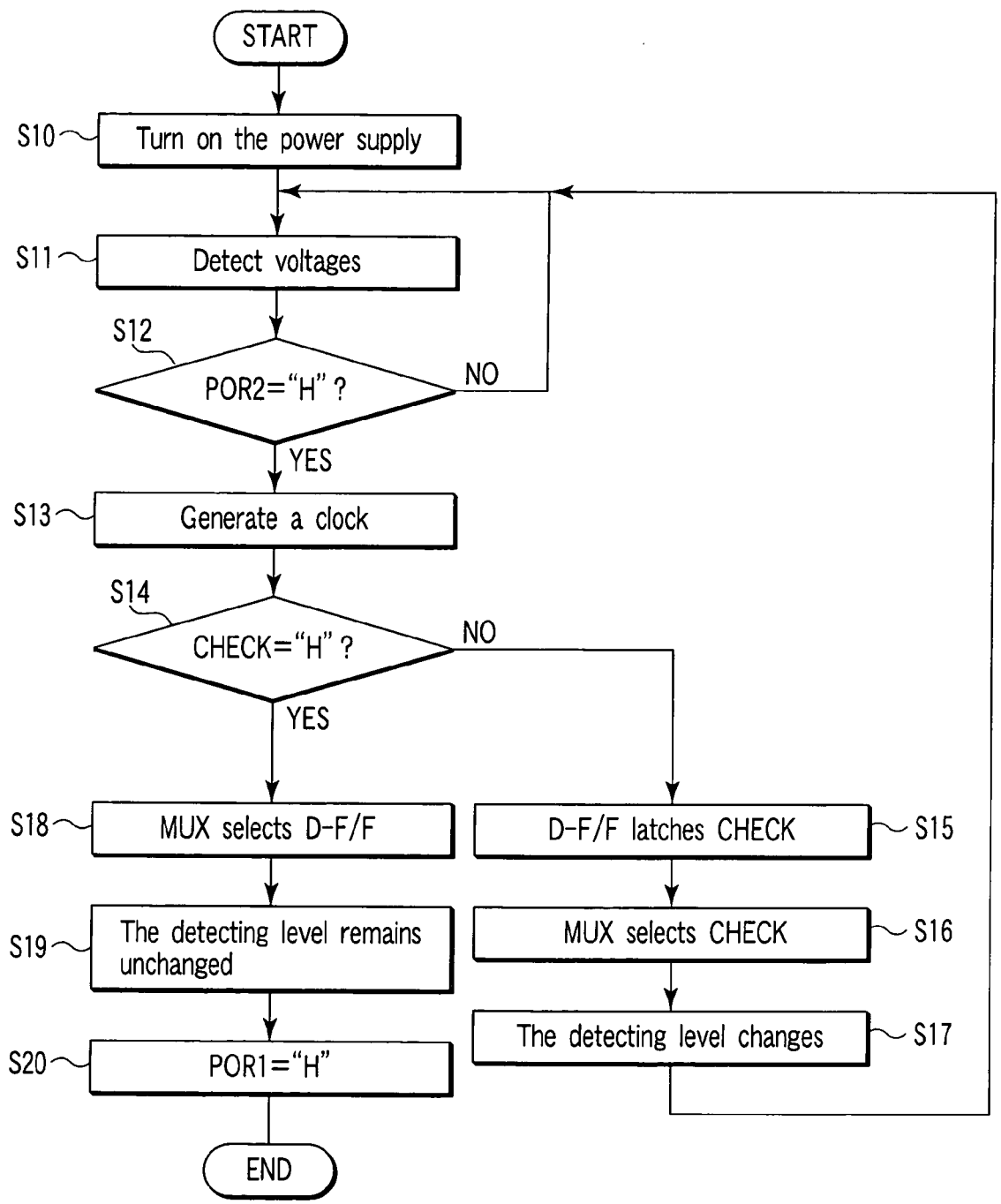
FIG. 6 is a flowchart for a voltage detecting method in the LSI of the first embodiment.

Next, the operation of the power-on reset circuit 4 configured as described above will be explained, using FIGS. 4 to 7. FIG. 6 is a flowchart for the operation of the power-on reset circuit. FIG. 7 is a timing chart of various signals.

First, the power supply is input to the LSI 1 (step S10). Then, the first and second detecting circuits 10, 11 of the power-on reset circuit 4 detect the voltages of the first and second power supplies V1, V2, respectively (step S11). Suppose the level control signal RESCTL is at the high (H) level immediately after the power supply is turned on. Then, since the MOS transistor 55 is on and the MOS transistor 56 is off in FIG. 5, the detecting level (or reference voltage Vref2) of the first detecting circuit 10 is determined by the series connection circuit of the resistive elements 52, 54.

If V1>Vref1 and V2>Vref2, then the output of the first detecting circuit and that of the second detecting circuit are both at the high (H) level. Therefore, the output of the AND gate 12, or the power-on reset signal POR2, is asserted (or is made high) (step S12, at time t1 in FIG. 7).

Then, in response to the power-on reset signal POR2, the clock generator 21 generates a clock CLK (step S13). Thereafter, the operation changes according to the detect signal CHECK output by the check circuit 20. Hereinafter, a case where the detect signal CHECK is low (L) and a case where the detect signal CHECK is high (H) will be explained as CASE 1 and CASE 2, respectively.

<CASE 1>

Suppose the detect signal CHECK is low (L) (CHECK "L") as shown in FIG. 7 at the time of step S12 (step S14). Specifically, suppose the analog circuit 30 in the configuration of FIG. 3 is not operating properly and at least either the output signal OUT of the level shifter 33 and the inverted output signal /OUT of the level shifter 34 is at the low (L) level or at least either the inverted output signal /OUT of the level shifter 33 and the output signal OUT of the level shifter 34 is at the high (H) level. Then, since the output of any one of EXNOR gates 31-0 to 31-3 goes to the low (L) level, the detect signal CHECK goes to the low (L) level. In this case, the output of the AND gate 13, or the power-on reset signal POR1, is at the low (L) level.

Then, since the output of the AND gate 23 is at the high (H) level during the period when CLK="H" (high), the D flip-flop 24 latches the detect signal CHECK="L" (low) (step S15). In addition, since CHECK="L" (low), the multiplexer 25 selects the detect signal CHECK ("L" level) (step S16. That is, the level control signal RESCTL goes to the low (L) level.

As a result, the MOS transistor 55 goes off and the MOS transistor 56 goes on. Specifically, the detect level (or reference voltage Vref2) of the first detecting circuit changes (step S17) and is determined by the series connection of the resistive elements 52, 53, 54.

Thereafter, using a new detecting level, the operations in step S10 and later are repeated again. The resistive element 53 is made effective in the variable resistive element 51, causing the detecting level to rise. Therefore, suppose the voltage is sufficient for the operation of the analog circuit, when the first power supply has reached the detecting level (step S12). Then, since the level shifters 33, 34 in the check circuit 20 also operate properly, the detect signal CHECK goes to the high (H) level (step S14, at time t2 in FIG. 7).

As a result, the output of the AND gate 23 goes to the low (L) level. Therefore, the D flip-flop 24 does not latch the detect signal CHECK. Since CHECK="H" (high), the multiplexer 25 selects the latched data in the D flip-flop 24 (step S18). That is, the level control signal RESCTL remains at the low (L) level. Therefore, the detecting level of the first detecting circuit 10 remains unchanged (step S19).

Furthermore, since POR1="H" and CHECK="H", the power-on reset signal POR1 is asserted (or is made high) (step S20). As a result, the analog circuit 2 and digital circuit 3 start to operate, thereby reading the data stored in, for example, the fuse circuit.

<CASE 2>

Next, suppose the detect signal CHECK is high (CHECK="H") as shown in FIG. 7 immediately after the power supply is turned on. Specifically, suppose the voltage of the first power supply has reached a sufficient value for the operation of the analog circuit and the level shifters 33, 34 of the check circuit 20 are also operating properly. Then, the detect signal CHECK is at the high (H) level (step S14, at time t2 in FIG. 1).

Since the output of the AND gate 23 is at the low (L) level, the D flip-flop 24 does not latch the detect signal CHECK. Since CHECK="H", the multiplexer 25 selects the initial data (high (H) level) latched in the D flip-flop 24 (step S18). That is, the level control signal RESCTL remains at the high (H) level (step S19). Therefore, the detecting level of the first detecting circuit 10 remains unchanged and is determined by the series connection circuit of the resistive elements 52, 54.

Since POR1="H" and CHECK="H", the power-on reset signal POR1 is asserted (or is made high) (step S20).

As described above, the semiconductor integrated circuit according to the first embodiment produces the effects in item (1) and item (2) as described below.

(1) The reliability of operation can be improved.

With the configuration of the first embodiment, in the LSI including the analog circuit which operates from the first power supply V1, the power-on reset circuit 4 includes the check circuit 20 for checking the operating state of the analog circuit. If the check circuit 20 has sensed that the analog circuit is not operating properly, or if the voltage of the first power supply V1 has not reached a sufficient value for an analog operation, the detecting level of the first detecting circuit 10 for detecting the first power supply V1 is raised. If the check circuit 20 has sensed that the analog circuit is operating properly, or if the voltage of the first power supply V1 has reached a sufficient value for an analog operation, the detecting level of the first detecting circuit is fixed.

Therefore, the detecting level of the first detecting circuit can be set to a necessary value for the operation of the analog circuit. Specifically, only when the first power supply V1 has reached a sufficient voltage for the operation of the analog circuit immediately after the power supply is turned on, the power-on reset signal ROR1 is asserted. Therefore, the analog circuit is prevented from operating erroneously unlike a case where the digital circuit operates immediately after the power supply is turned on, but the analog circuit does not operate. Consequently, the reliability of the operation of the LSI is improved.

(2) The operation can be stabilized.

With the configuration of the first embodiment, the power-on reset circuit 4 includes the control circuit 14. The control circuit 14 controls the detecting level of the first detecting circuit 10. Consequently, even when the first voltage fluctuates, the power-on reset signal POR1 can be stabilized, thereby enabling the operation of the LSI to be stabilized.

Specifically, even in a case where the first voltage rises and drops repeatedly on a small scale, when the detect signal CHECK has gone to the low (L) level even once, the detecting level rises from that time on. Therefore, even if the first voltage rises again after it has dropped, the power-on reset signal POR2 won't go to the high (H) level unless the first voltage has reached the raised detecting level. In this way, fluctuations in the power-on reset signal as those in the voltage of the first power supply can be suppressed.

Figure 8:
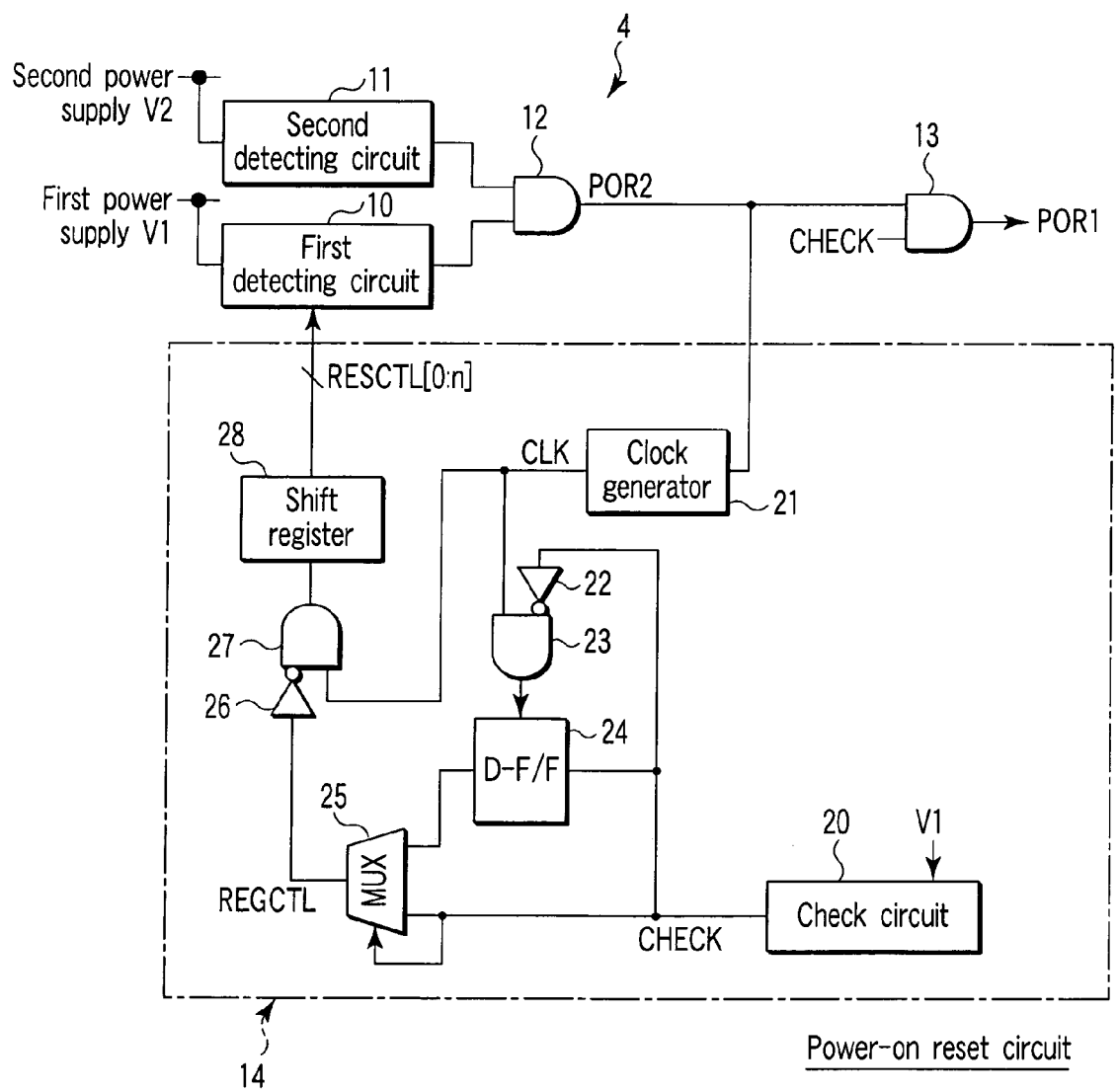
FIG. 8 is a circuit diagram of a power-on reset circuit included in an LSI according to a second embodiment of the present invention.

Next, a semiconductor integrated circuit apparatus according to a second embodiment of the present invention will be explained. The second embodiment is such that the number of detecting levels of the first detecting circuit 10 is increased to 3 or more. FIG. 8 is a circuit diagram of the power-on reset circuit 4 included in an LSI according to the second embodiment. Hereinafter, only what differs from the first embodiment will be explained.

As shown in FIG. 8, the control circuit 14 further includes an inverter 26, an AND gate 27, and a shift register 28 in the configuration of FIG. 2 explained in the first embodiment. The multiplexer 25 outputs the selected signal as a register control signal REGCTL in place of the level control signal RESCTL. The inverter 26 inverts the register control signal REGCTL. The AND gate 27 performs the AND operation of the clock CLK and the output signal of the inverter 26. The shift register 28 holds (n+1) bits data. Then, the shift register 28 outputs the data as a level control signal RESCTL [0:n] to the first detecting circuit 10. The default value of the level control signal RESCTL [0:n] is (0000 . . . 1). Only the least significant bit is "1". The shift register 28 shifts bit "1" upward each time it receives the high (H) level signal from the AND gate 27.

Unlike in the first embodiment, the multiplexer 25 selects the data stored in the D flip-flop 24 when the detect signal CHECK is at the low level or selects the detect signal CHECK when the detect signal CHECK is at the high (H) level. Furthermore, the D flip-flop 24 holds the low (L) level as the initial value.

Figure 9:
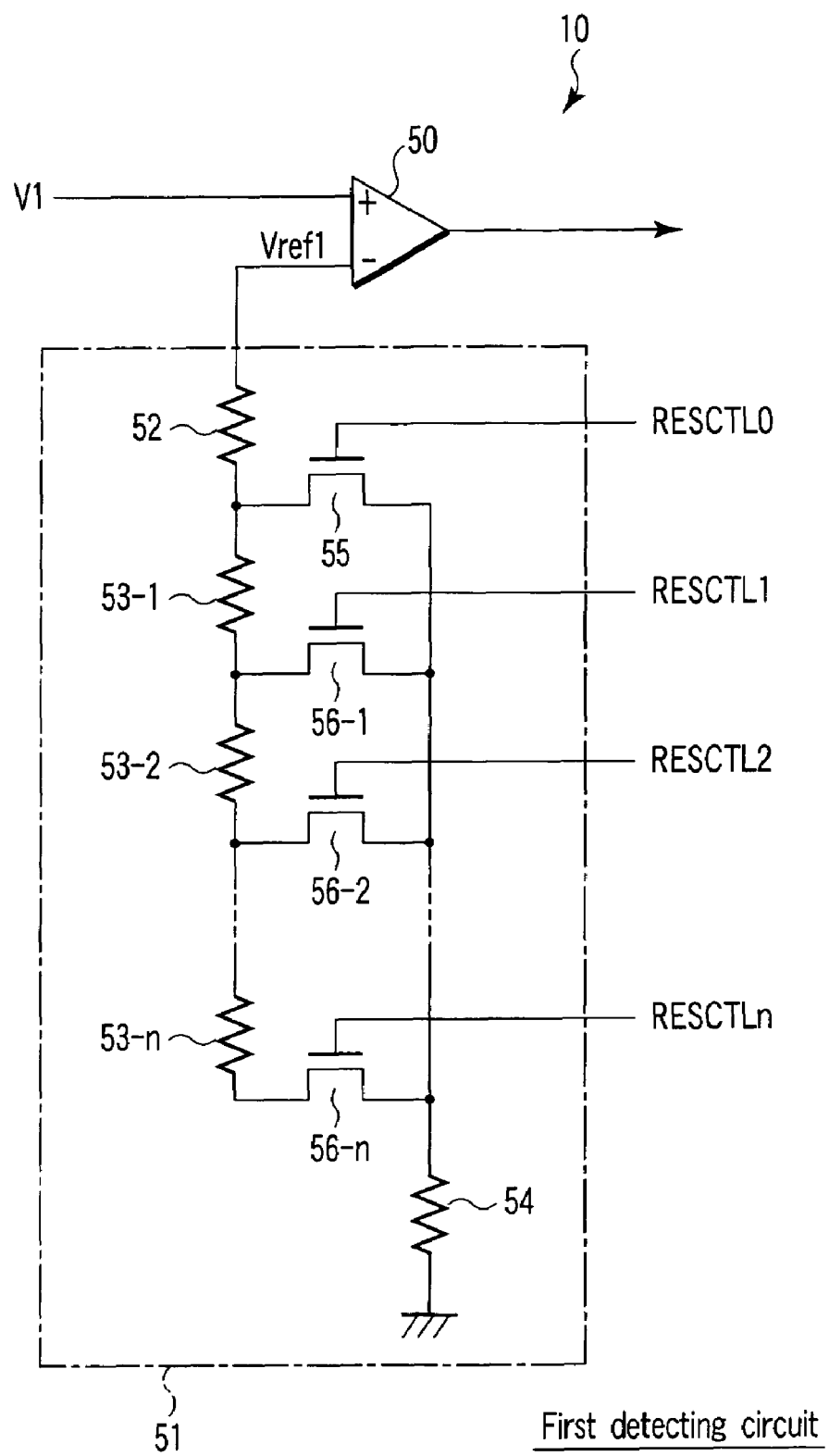
FIG. 9 is a circuit diagram of a first detecting circuit included in the LSI of the second embodiment.

FIG. 9 is a circuit diagram of an example of the first detecting circuit 10. As shown in FIG. 9, the variable resistive element 51 included in the first detecting circuit 10 has an n number of sets of a resistive element 53 and a MOS transistor 56 in the configuration of FIG. 5 explained in the first embodiment. Specifically, an n number of resistive elements 53-1 to 53-n are connected between the resistive element 52 and resistive element 54. Moreover, an n number of MOS transistors 56-1 to 56-n are connected between the resistive elements 53-1 to 53-n and the resistive element 54, respectively. Then, the individual bits of the level control signal RESCTL [0:n] are input to the gate of the MOS transistor 55 and the gates of the MOS transistors 56-1 to 56-n, respectively. Specifically, the least significant bit of the signal RESCTL is input to the gate of the MOS transistor 55, the second bit of the signal RESCTL is input to the gate of the MOS transistor 56-1, and the most significant bit of the signal RESCTL is input to the gate of the MOS transistor 56-n.

Figure 10:
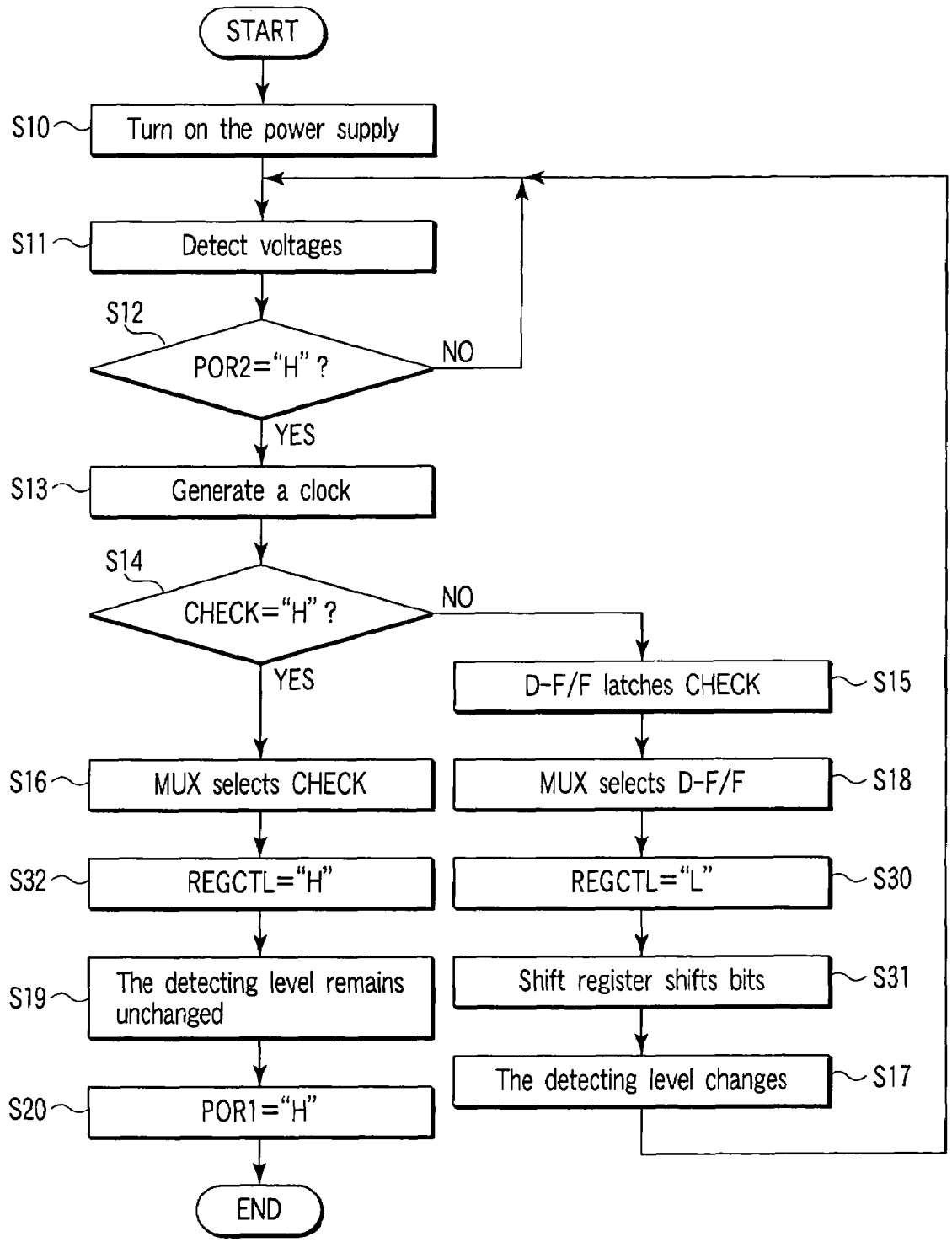
FIG. 10 is a flowchart for a voltage detecting method in the LSI of the second embodiment.

Next, the operation of the power-on reset circuit 4 configured as described above will be explained using FIGS. 8 to 10. FIG. 10 shows a flowchart for the operation of the power-on reset circuit 4.

First, the power supply is input to the LSI 1 (step S10). Then, the first and second detecting circuits 10, 11 of the power-on reset circuit 4 detect the voltages of the first and second power supplies V1, V2 (step S11). Immediately after the power supply is turned on, only the least significant bit of the level control signal RESCTL [0:n] is "1". Therefore, in FIG. 9, the MOS transistor 55 is on and the MOS transistors 56-1 to 56-n are off. As a result, the detecting level (or reference voltage Vref2) of the first detecting circuit 10 is determined by the series connection circuit of the resistive elements 52, 54.

If V1>Vref1 and V2>Vref2, then the output of the first detecting circuit and that of the second detecting circuit are both at the high (H) level. Therefore, the power-on reset signal POR2 is asserted (or is made high) (step S12).

Then, in response to the power-on reset signal POR2, the clock generator 21 generates a clock CLK (step S13). Thereafter, the operation changes according to the detect signal CHECK output from the check circuit 20.

When the analog circuit 30 is not operating properly and the detect signal CHECK is low (CHECK="L") (step S14), the output of the AND gate 23 is at the high (H) level. Therefore, the D flip-flop 24 latches the detect signal CHECK="L" (low) (step S15). In addition, since CHECK="L", the multiplexer 25 selects the data (low (L) level) held in the D flip-flop 24 (step S18). That is, the register control signal REGCTL goes to the low (L) level (step S30).

Then, since the output of the AND gate 27 goes to the high (H) level, the shift register 28 shifts bits in the level control signal RESCTL [0:n] upward (step S31). Specifically, the level control signal RESCTL [0:n] changes from (0000 . . . 01) to (0000 . . . 10).

As a result, the detecting level of the first detecting circuit 10 changes (step S17). Specifically, in the variable resistive element 51 of the first detecting circuit 10, the MOS transistor 55 goes into the off state and the MOS transistor 56-1 goes into the on state. Therefore, the detecting level (or reference voltage Vref2) of the first detecting circuit 10 is determined by the series connection circuit of the resistive elements 52, 53-1, 54.

Thereafter, using the new detecting level obtained in step S17, the operations in step 10 and later are repeated again. In the variable resistive element 51, the resistive element 53 is made effective, causing the detecting level to rise. In this case, too, if the analog circuit 30 does not operate properly, steps S15, S18, S30, S31, and S17 are carried out, thereby turning off the MOS transistor 56-1 and turning on the MOS transistor 56-2. This process can turn on up to the MOS transistor 56-n. Consequently, the maximum value of the detecting level is determined by the series resistance of the resistive elements 52, 53-1 to 53-n, and 54.

When the detect signal CHECK goes to the high (H) level at any point in time (step S14), the output of the AND gate 23 goes to the low (L) level. Therefore, the D flip-flop 24 does not latch a new detect signal CHECK. In addition, the multiplexer 25 selects the detect signal CHECK (step S16). Thus, the output of the multiplexer 25, or the register control signal REGCTL, goes to the high (H) level (step S32). Then, since the output of the AND gate 27 goes to the low (L) level, the shift register 28 does not shift bits in the level control signal RESCTL [0:n] and keeps the preceding value. Thus, the detecting level of the first detecting circuit 10 is kept at the preceding value (step S19).

Since POR1="H" and CHECK="H", the power-on reset signal POR1 is asserted (or is made high) (step S20). As a result, the analog circuit 2 and digital circuit 3 start to operate, thereby, for example, reading the data stored in the fuse circuit.

The configuration according to the second embodiment produces the effect in the following item (3) in addition to the effects in item (1) and item (2).

(3) The detecting level can be set more accurately.

In the second embodiment, the control circuit 14 of the power-on reset circuit 4 includes the shift register 28 which holds an (n+1)-bit level control signal RESCTL [0:n]. The variable resistive element 51 of the first detecting circuit 10 includes an n number of resistive elements 56-1 to 56-n and an n number of MOS transistors 56-1 to 56-n. The individual bits in the level control signal RESCTL [0:n] are allocated to the gates of the MOS transistors 55, 56-1 to 56-n, respectively. Therefore, the resistance of the variable resistive element 51, or the reference voltage Vref1 can be set to a plurality of values (e.g., (n+1) values). As described above, since the reference voltage Vref1 can be fine-tuned, enabling the necessary detecting level to be set accurately, which helps prevent the first power supply V1 from being set uselessly high.

Next, a semiconductor integrated circuit according to a third embodiment of the present invention will be explained. The third embodiment is such that the configuration of the check circuit 20 is modified in the first embodiment. Hereinafter, since the configuration excluding the check circuit 20 is the same as that of the first embodiment, explanation will be omitted.

Figure 11:
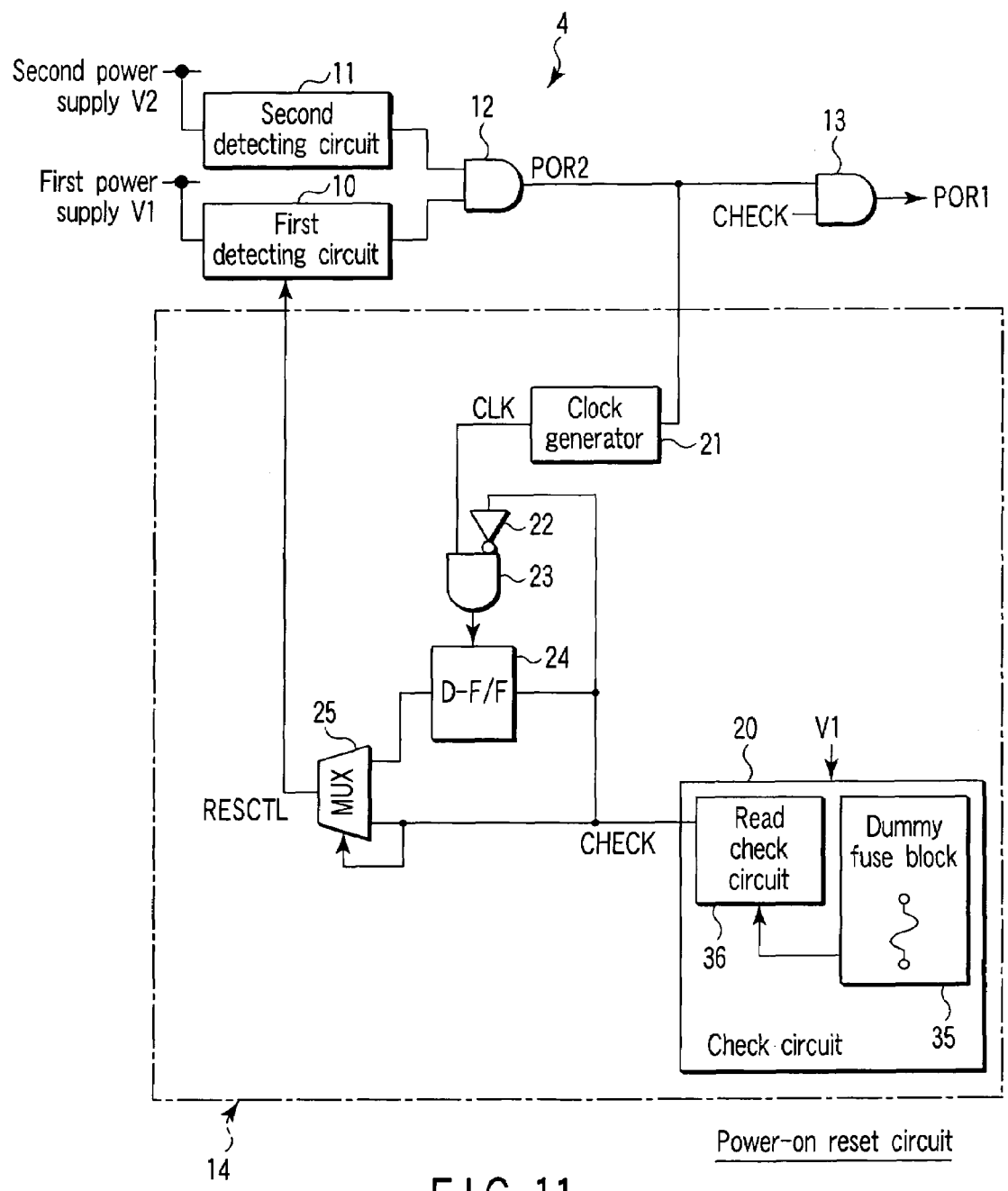
FIG. 11 is a circuit diagram of a power-on reset circuit included in an LSI according to a third embodiment of the present invention.

FIG. 11 is a circuit diagram of the power-on reset circuit 4 according to the third embodiment. As shown in FIG. 11, the check circuit 20 includes a dummy fuse block 35 and a read check circuit 36. The dummy fuse block, which includes a fuse element, has the same configuration as that of the fuse circuit included in, for example, the analog circuit 2. The read check circuit 36 reads the data from the dummy fuse block. When having carried out the reading operation properly, the read check circuit 36 asserts the detect signal CHECK.

As described above, the dummy fuse block is used as the analog circuit 30 in place of the level shifter. Even when a failure in the analog circuit in the dummy fuse block has been detected, the same operation as in the first embodiment can be performed, which produces the same effects as those in item (1) and item (2).

Figure 12:
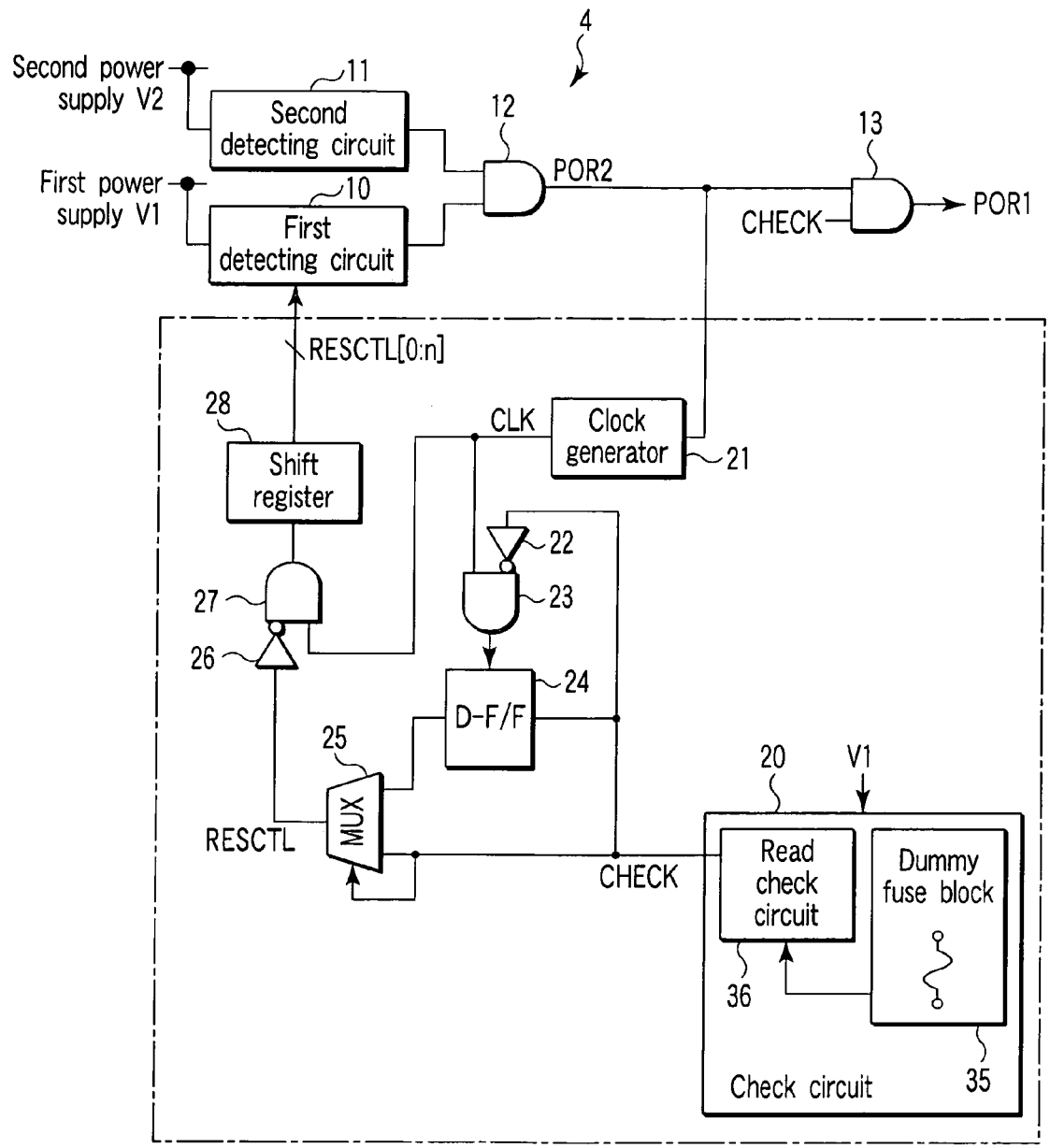
FIG. 12 is a circuit diagram of a power-on reset circuit included in an LSI according to a fourth embodiment of the present invention.

Next, a semiconductor integrated circuit according to a fourth embodiment of the present invention will be explained. The fourth embodiment is a combination of the second and third embodiments. Specifically, as shown in FIG. 12, in the configuration of the second embodiment, the check circuit 20 includes a dummy fuse block 35 and a read check circuit 36.

With this configuration, the same operation as that of the second embodiment can be realized and the same effects as those in item (1) to item (3) can be obtained.

Next, a semiconductor integrated circuit according to a fifth embodiment of the present invention will be explained. The fifth embodiment is such that the first to fourth embodiments are applied to a memory-embedded system LSI. FIG. 13 is a block diagram of the system LSI according to the fifth embodiment.

As shown in FIG. 13, the system LSI 100 comprises a CPU 101, a 2Tr flash memory 102, a voltage generator (or voltage generating circuit) 103, and a power-on reset circuit 104.

The voltage generator 103 generates a plurality of internal voltages on the basis of a voltage Vcc1 (=1.25 V to 1.65 V). The voltage generator 103 includes a negative charge pump circuit and a positive charge pump circuit. Then, the voltage generator 103 generates negative voltages VBB1 (=−7 V) and VBB2 (=−8 V) and positive voltages VPP (=12 V) and Vcc (=3 V).

The power-on reset circuit 104 corresponds to the power-on reset circuit 4 explained in the first to fourth embodiments. Here, Vcc1 is input as the first power supply V1 and VBB1, VBB2, VPP, and Vcc2 are input as the second power supply V2. Therefore, the power-on reset circuit 104 may include four configurations each shown in one of FIG. 2, 8, 11, or 12 and detect VBB1, VBB2, VPP, and Vcc2, Vcc1 in the respective circuits. Alternatively, in the configuration of FIG. 2, 8, 11, or 12, one first detecting circuit and four units of the second detecting circuit 10 may be provided. In this case, the individual second detecting circuits 10 detect VBB1, VBB2, VPP, and Vcc2, respectively. In addition, in the check circuit shown in FIG. 3, VBB1, VBB2, VPP, and Vcc2 are input as the second voltage 2 to the EXNOR gates 31-0 to 31-3, respectively.

The CPU 101 is a circuit which carries out a digital operation and corresponds to the digital circuit 3 of FIG. 1. The CPU 101, which operates using the voltage Vcc1 (or the first power supply V1) externally input as a power supply voltage, exchanges data with the flash memory 102. The CPU 101 can start to operate when the power-on reset signal POR1 output from the power-on reset circuit 104 is asserted.

The flash memory 102, which corresponds to the analog circuit of FIG. 1, operates using Vcc1 (or the first power supply V1), VBB1, VBB2, VPP, and Vcc2 (or the second power supply V2). Then, when the power-on reset signal POR1 output from the power-on reset circuit 104 is asserted, the flash memory 102 can start to operate. The flash memory 102 includes a memory cell array 110, a write decoder 120, a select gate decoder 130, a column decoder 140, a write circuit 150, a read circuit 160, a source line driver 170, a switch group 180, and an input buffer 190.

Figure 14:
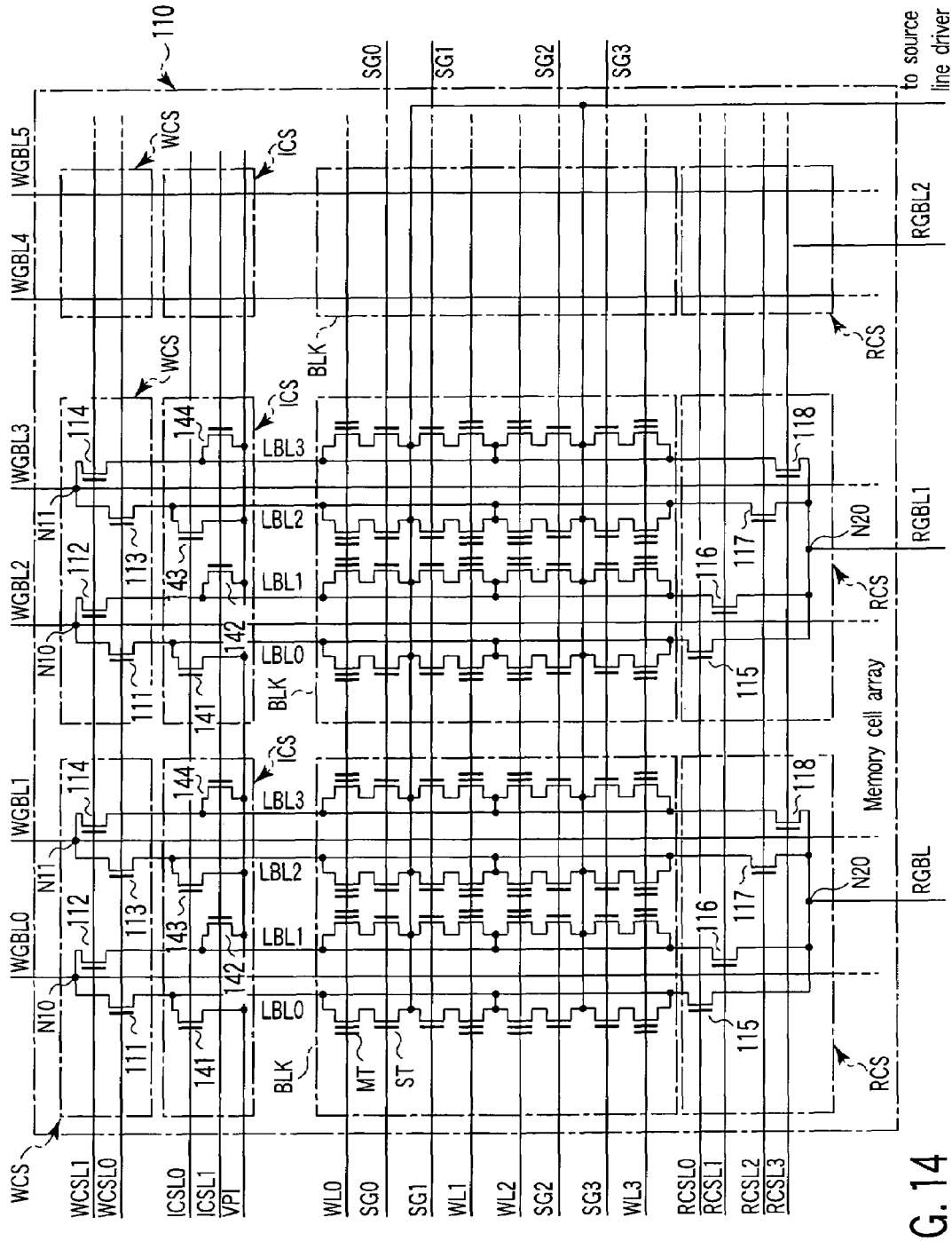
FIG. 14 is a circuit diagram of the memory cell array of a 2Tr flash memory included in the LSI of the fifth embodiment.

The memory cell array 110 has a plurality of memory cells arranged in a matrix. The configuration of the memory cell array 110 will be explained using FIG. 14. FIG. 14 is a circuit diagram of a part of the memory cell array 110.

As shown in FIG. 14, the memory cell array 110 has (m+1)×(n+1) memory cell blocks BLK (m and n are natural numbers). The memory cell array 110 further has write column selectors WCS, read column selectors RCS, and write inhibit column selectors ICS, which are provided for the memory cell blocks BLK in a one-to-one correspondence.

Each of the memory cell blocks BLK includes a plurality of memory cells MC. The memory cells MC constitute the memory cells of a 2Tr flash memory. Specifically, each of the memory cells MC includes a memory cell transistor MT and a select transistor ST. The source of the memory cell transistor MT is connected to the drain of the select transistor ST. The memory cell transistor MT has a stacked gate structure that includes a floating gate formed on a semiconductor substrate with a gate insulating film interposed therebetween and a control gate formed on the floating gate with an inter-gate insulating film interposed therebetween. Memory cells MC adjoining each other in the column direction share the drain region of the memory cell transistor MT or the source region of the select transistor ST. Each of the memory cell blocks BLK includes (4×4) memory cells MC. Although the number of memory cells MC arranged in the column direction is 4 in FIG. 14, this is illustrative and not restrictive. For instance, the number of memory cells MC may be 8 or 16. The drain regions of the memory cell transistors MT arranged in four columns are connected to four local bit lines LBL0 to LBL3 in a one-to-one correspondence. One end of each of local bit lines LBL0 to LBL3 is connected to a write column selector WCS and the other end is connected to a read column selector RCS.

In the memory cell array 110, the control gates of the memory cell transistors MT in a same row are connected commonly to any one of word lines WL0 to WL(4m−1). The gates of the select transistors ST in a same row are connected commonly to any one of select gate lines SG0 to SG(4m−1). Local bit lines LBL0 to LBL3 connect commonly the memory cell transistors in a same column in each of the memory cell blocks BLK, whereas the word lines WL and select gate lines SG connect the memory cell transistors and select transistors in a row to one another even across the memory cell blocks. Word lines WL0 to WL(4m−1) are connected to the write decoder 20. One end of each of select gate lines SG0 to SG(4m−1) is connected to the write decoder 20. The other ends of select gate lines SG0 to SG(4m−1) are connected to the select gate decoder 30. The source regions of the select transistors ST are connected to one another across a plurality of memory cell blocks BLK and then are connected to the source line driver 170.

Next, the configuration of a write column selector WCS will be explained. Each of the write column selectors WCS includes four MOS transistors 111 to 114. One end of the current path of each of the MOS transistors 111 to 114 is connected to one end of the corresponding one of local bit lines LBL0 to LBL3. The other ends of the current paths of the MOS transistors 111 and 112 are connected to each other and the other ends of the current paths of the MOS transistors 113 and 114 are connected to each other. Hereinafter, the common junction node of the MOS transistors 111 and 112 is called node N10 and the common junction node of the MOS transistors 113 and 114 is called node N11. The gates of the MOS transistors 111 to 114 are connected to any one of write column select lines WCSL0 to WCSL(2m−1). The MOS transistors 111, 113 included in the write column selectors WCS in a row are connected to the same one of the write column select lines WCSL(i−1) (i: 1, 3, 5, . . . ). The MOS transistors 112, 114 included in the write column selectors WCS in the same row are connected to the same one of the write column select lines WCSLi. One of the write column select lines WCSL0 to WCSL(2m−1) is selected by the column decoder 140 in a write operation.

Each of the nodes N10, N11 in the write column selector WCS is connected to any one of write global bit lines WGBL0 to WGBL(2n−1). Each of the write global bit lines WGBL0 to WGBL(2n−1) is connected commonly to the nodes N10 or nodes N11 of the write column selectors WCS in a column. Write global bit lines WGBL0 to WGBL(2n−1) are connected to the write circuit 150.

Next, the configuration of a read column selector RCS will be explained. Each of the read column selectors RCS includes four MOS transistors 115 to 118. One end of the current path of each of the MOS transistors 115 to 118 is connected to one end of the corresponding one of the local bit lines LBL0 to LBL3. The other ends of the current paths of the MOS transistors 115 and 118 are connected to each other. Hereinafter, the common junction node of the MOS transistors 115 and 118 is called node N20. Each of the gates of the MOS transistors 115 to 118 is connected to a different one of the read column select lines RCSL0 to RCSL(4m−1). Each of the MOS transistors 115 to 118 included in the read column selectors RCS in a same row is connected to the same one of the read column select lines RCSL0 to RCSL(4m−1). One of the read column select lines RCSL0 to RCSL(4m−1) is selected by the column decoder 140 in a read operation.

Node 20 in the read column selector RCS is connected to any one of the read global bit lines RGBL0 to RGBL(n−1). Each of the read global bit lines RGBL0 to RGBL(n−1) is connected commonly to the nodes N20 in the read column selectors RCS in a same column. Read global bit lines RGBL0 to RGBL(n−1) are connected to the read circuit 160.

Next, the configuration of a write inhibit column selector ICS will be explained. Each of the write inhibit column selectors ICS includes four MOS transistors 141 to 144. One end of the current path of each of the MOS transistors 141 to 144 is connected to one end of the corresponding one of the local bit lines LBL0 to LBL3. A write inhibit voltage VPI is applied commonly to the other ends of the current paths of the MOS transistors 141 and 144. The gates of the MOS transistors 141 to 144 are connected to any one of the write inhibit column select lines ICSL0 to ICSL(2m−1). The MOS transistors 141, 143 included in the write inhibit column selectors ICS in a row are connected to the same one of the write column select lines WCSL(i−1) (i: 1, 3, 5, . . . ). The MOS transistors 142, 144 included in the write column selectors ICS in the same row are connected to the same one of the write column select lines WCSLi. One of the write inhibit column select lines ICSL0 to ICSL(2m−1) are selected by the column decoder 140 in a write operation. The number of memory cells in the memory cell block, the number of read global bit lines RGBL, and the number of write global bit lines WGBL are not limited to those in the fifth embodiment.

Referring to FIG. 13, the explanation will be continued. The write circuit 150 not only latches the write data but also resets the write global bit lines WGBL.

The input buffer 190 holds the write data given by the CPU 101.

The switch group 180 transfers the write data held in the input buffer 190 to the write circuit 150.

Figure 15:
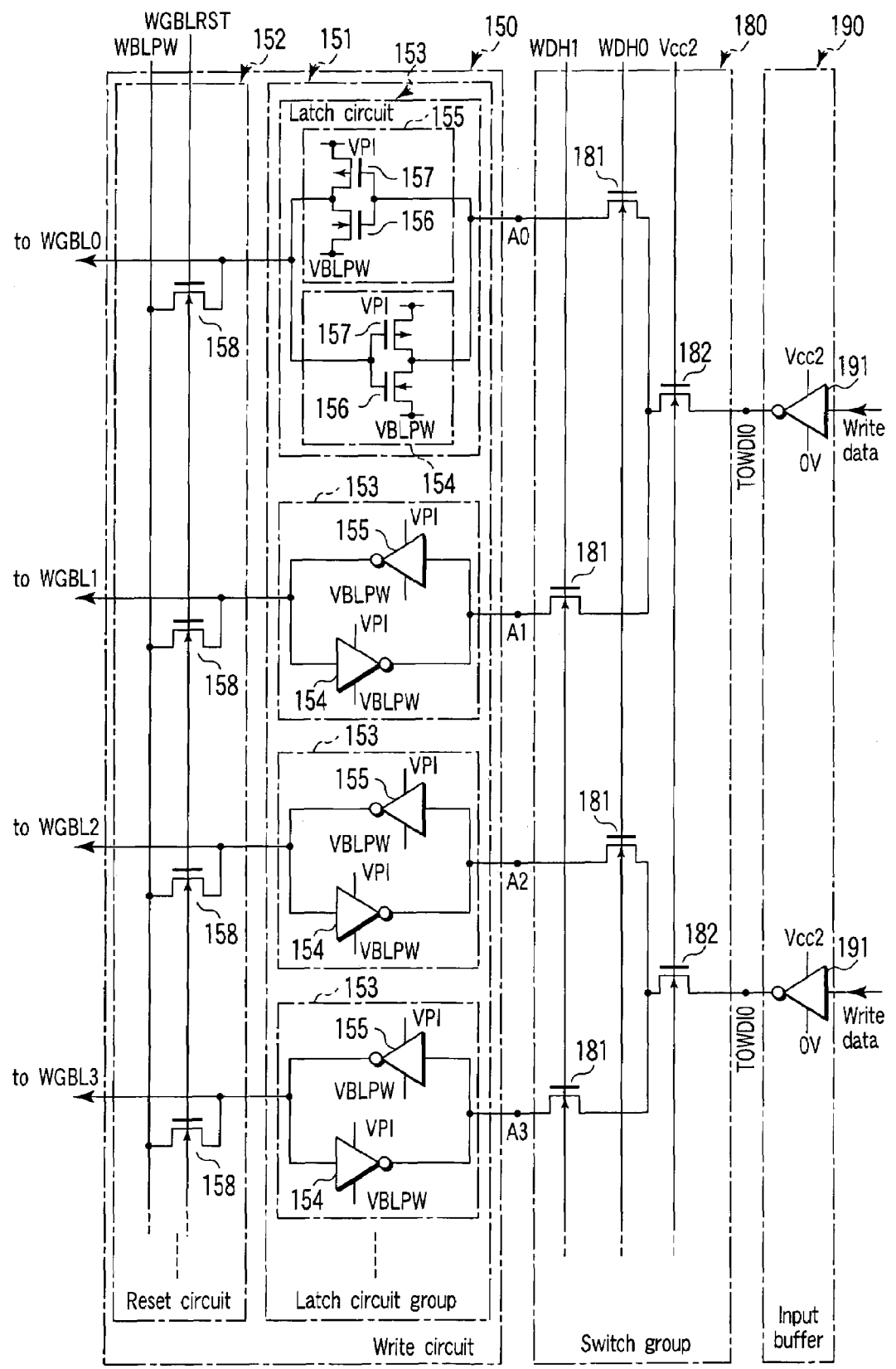
FIG. 15 is a circuit diagram of the write circuit, switch group, and input buffer of a 2Tr flash memory included in the LSI of the fifth embodiment.

The configuration of the write circuit 150, switch group 180, and input buffer 190 will be explained using FIG. 15. FIG. 15 is a circuit diagram of the write circuit 150, switch group 180, and input buffer 190.

First, the write circuit 150 will be explained. The write circuit 150 includes a latch circuit group 151 and a reset circuit 152. The latch circuit group 151 includes latch circuits 153 provided for write global bit lines WGBL0 to WGBL(2n−1) in a one-to-one correspondence. Each of the latch circuits 153 has two inverters 154, 155. The input terminal of the inverter 154 is connected to the output terminal of the inverter 155. The output terminal of the inverter 154 is connected to the input terminal of the inverter 155. The junction node of the input terminal of the inverter 154 and the output terminal of the inverter 155 makes the output node of the latch circuit 153, which is connected to the corresponding write global bit line. Each of the inverters 154, 155 has an n-channel MOS transistor 156 and a p-channel MOS transistor 157 whose current paths are connected in series. The source of the n-channel MOS transistor 156 is connected to VBLPW node and the source of the p-channel MOS transistor 157 is connected to the write inhibit voltage node VPI. The gate of the n-channel MOS transistor 156 and the gate of the p-channel MOS transistor 157 are connected to one another. Then, the junction node of the drain of the p-channel MOS transistor 157 and the drain of the n-channel MOS transistor 156 in the inverter 155 is connected to the junction node of the gate of p-channel MOS transistor 157 and the gate of n-channel MOS transistor 156 in the inverter 154 and is further connected to a write global bit line. In addition, the junction node of the drain of the p-channel MOS transistor 157 and the drain of the n-channel MOS transistor 156 in the inverter 154 is connected to the junction node of the gate of the p-channel MOS transistor 157 and the gate of the n-channel MOS transistor 156 in the inverter 155. This junction node makes the input node of the latch circuit 153.

The reset circuit 152 includes n-channel MOS transistors 158 provided for write global bit lines WGBL0 to WGBL(2n−1) in a one-to-one correspondence. The drains of the n-channel MOS transistors 158 are connected to the corresponding write global bit lines. Their sources are connected commonly to VBLPW node and their gates are connected commonly to WGBLRST node.

The switch group 180 includes n-channel MOS transistors 181 provided for the latch circuits 153 in a one-to-one correspondence and n-channel MOS transistors 182. One end of each of the MOS transistors 181 is connected to the input node of the corresponding latch circuit 153. The other ends of the current paths of the two MOS transistors 181 each connected to adjacent latch circuits are connected to each other. That is, the MOS transistors 181 connected to the latch circuits 153 each corresponding to write global bit lines WGBL0, WGBL1 share the other end of their current path. The same holds true for the MOS transistors 181 connected to the latch circuits 153 each corresponding to write global bit lines WGBL2, WGBL3. The gates of the MOS transistors 181 connected to the latch circuits 153 corresponding to write global bit lines WGBL(i−1) (i=1, 3, 5, . . . ) are connected commonly to WDH0 node. The gates of the MOS transistors 181 connected to the latch circuits 153 corresponding to write global bit lines WGBLi are connected commonly to WDH1 node. The other ends of the current paths of the MOS transistors 181 connected to one another are connected to one end of the current path of a MOS transistor 182. A positive voltage Vcc2 is applied to the gates of the MOS transistors 182 at the same time. Hereinafter, the junction nodes of the MOS transistors 181 and the input nodes of the latch circuits 153 are referred to as nodes A0 to A(2n−1).

Next, the input buffer 190 will be explained. The input buffer 190 includes inverters 191 provided for the MOS transistors 182 in the switch group 180 in a one-to-one correspondence. The write data supplied from the CPU 101 is inputted to the input node of the inverter 191. The output node of the inverter 191 is connected to the other end of the current path of the MOS transistor 182. The inverter 191 operates with a high-voltage power supply potential of Vcc2 and a low-voltage power supply potential of 0 V. Hereinafter, the junction nodes of the output nodes of the inverters 191 and the MOS transistors 182 are called nodes TOWDI0 to TOWDI((2n−1)/2).

Referring to FIG. 13, the explanation of LSI 100 will be continued.

The column decoder 140 decodes a column address signal, thereby producing a column address decode signal. On the basis of the column address decode signal, the column select lines WCSL, RCSL, ICSL are selected.

In a read operation, the read circuit 160 precharges read global bit lines RGBL0 to RGBL(n−1) and amplifies the data read onto read global bit lines RGBL0 to RGBL(n−1).

The source line driver 170 supplies a voltage to the source lines SL.

The write decoder 120 not only selects any one of word lines WL0 to WL(4m−1) in a write operation and applies a positive potential (12 V) to the selected word line but also applies a negative potential (−7 V) to the p-well region in which the memory cell array has been formed and to all of the select gate lines SG0 to SG(4m−1). Moreover, in an erase operation, the write decoder 120 not only applies a negative potential VBB2 (−8 V) to all the word lines but also applies a positive voltage VPP to the p-well region in which the memory cell array has been formed.

The select gate decoder 130, in a read operation, selects any one of select gate lines SG0 to SG(4m−1) and applies a positive potential Vcc2 to the selected gate line.

Figure 16:
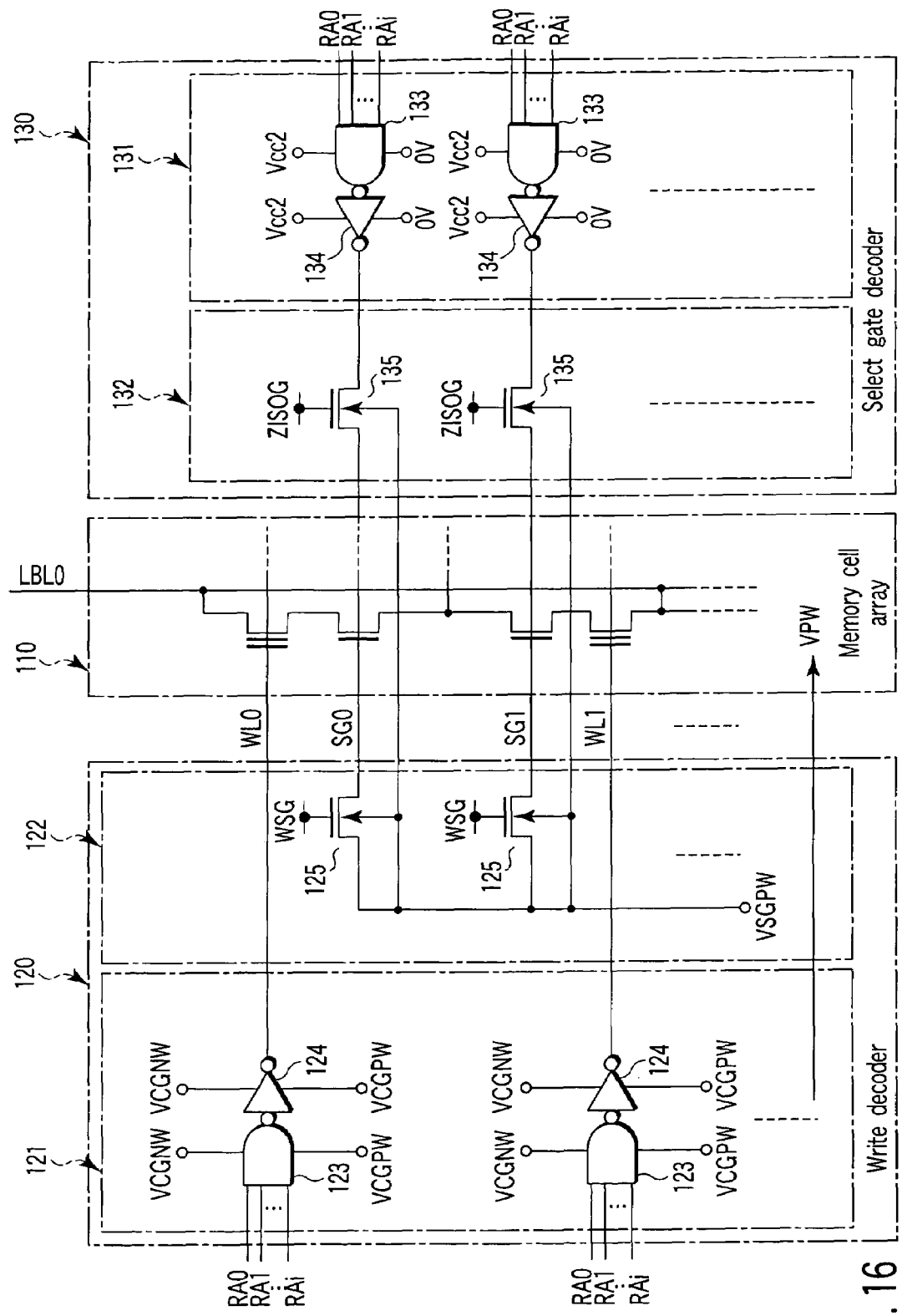
FIG. 16 is a circuit diagram of the memory cell array, write decoder, and select gate decoder of a 2Tr flash memory included in the LSI of the fifth embodiment.

The configuration of the write decoder 120 and select gate decoder 130 will be explained using FIG. 16. First, the configuration of the select gate decoder 130 will be explained. The select gate decoder 130 includes a row address decode circuit 131 and a switch element group 132. The row address decode circuit 131, which operates on the power supply voltage Vcc2, decodes (i+1)-bit row address signals RA0 to RAi, thereby producing a row address decode signal. The row address decode circuit 131 includes NAND circuits 133 and inverters 134 provided for select gate lines SG0 to SG(4m−1) in a one-to-one correspondence. The NAND circuit 133 performs NAND operation on each bit in the row address signals RA0 to RAi. Then, the inverter 134 inverts the result of the NAND operation and outputs the result as a row address decode signal.

The switch element group 132 has n-channel MOS transistors 135. The n-channel MOS transistors 135 are provided for select gate lines SG0 to SG(4m−1) in a one-to-one correspondence. The outputs of the inverters 34 are supplied to select gate lines SG0 to SG(4m−1) via the current paths of the n-channel MOS transistors 135. A control signal ZISOG is input to the gates of the n-channel MOS transistors 135. The control signal ZISOG turns off the MOS transistors 135 in a write and an erase operation and turns on the MOS transistors 35 in a read operation.

Next, the configuration of the write decoder 120 will be explained. The write decoder 120 includes a row address decode circuit 121 and a switch element group 122. The row address decode circuit 121 decodes (i+1)-bit row address signals RA0 to RAi, thereby producing a row address decode signal. The row address signal is supplied to word line WL0 to WL(4m−1). The row address decode circuit 121 includes NAND circuits 123 and inverters 124 provided for word lines WL0 to WL(4m−1) in a one-to-one correspondence. The NAND circuit 123 and inverter 124 have their high power supply voltage nodes connected to VCGNW node and their low power supply voltage nodes connected to VCGPW node. The NAND circuit 123 performs NAND operation on each bit in the row address signals RA0 to RAi. Any one of Vcc1, 0 V, the positive voltage VPP, and the negative voltages VBB1, VBB2 is applied to the power supply voltage nodes VCGNW, VCGPW. Then, the inverter 124 inverts the result of the NAND operation and outputs the result as a row address decode signal.

The switch element group 122 has n-channel MOS transistors 125. The n-channel MOS transistors 125 are provided for select gate lines SG0 to SG(4m−1) in a one-to-one correspondence. One end of the current path of each of the MOS transistors 125 is connected to the corresponding one of select gate lines SG0 to SG(4m−1). The other ends of the current paths of the MOS transistors 125 are connected to VSGPW node. VPB1, VPP, or 0 V is applied to VSGPW node. A control signal WSG is input to the gate of each of the MOS transistors 125. The control signal WSG turns on the MOS transistors 125 in a write operation and turns off the MOS transistors 125 in an erase and a read operation.

Figure 17:
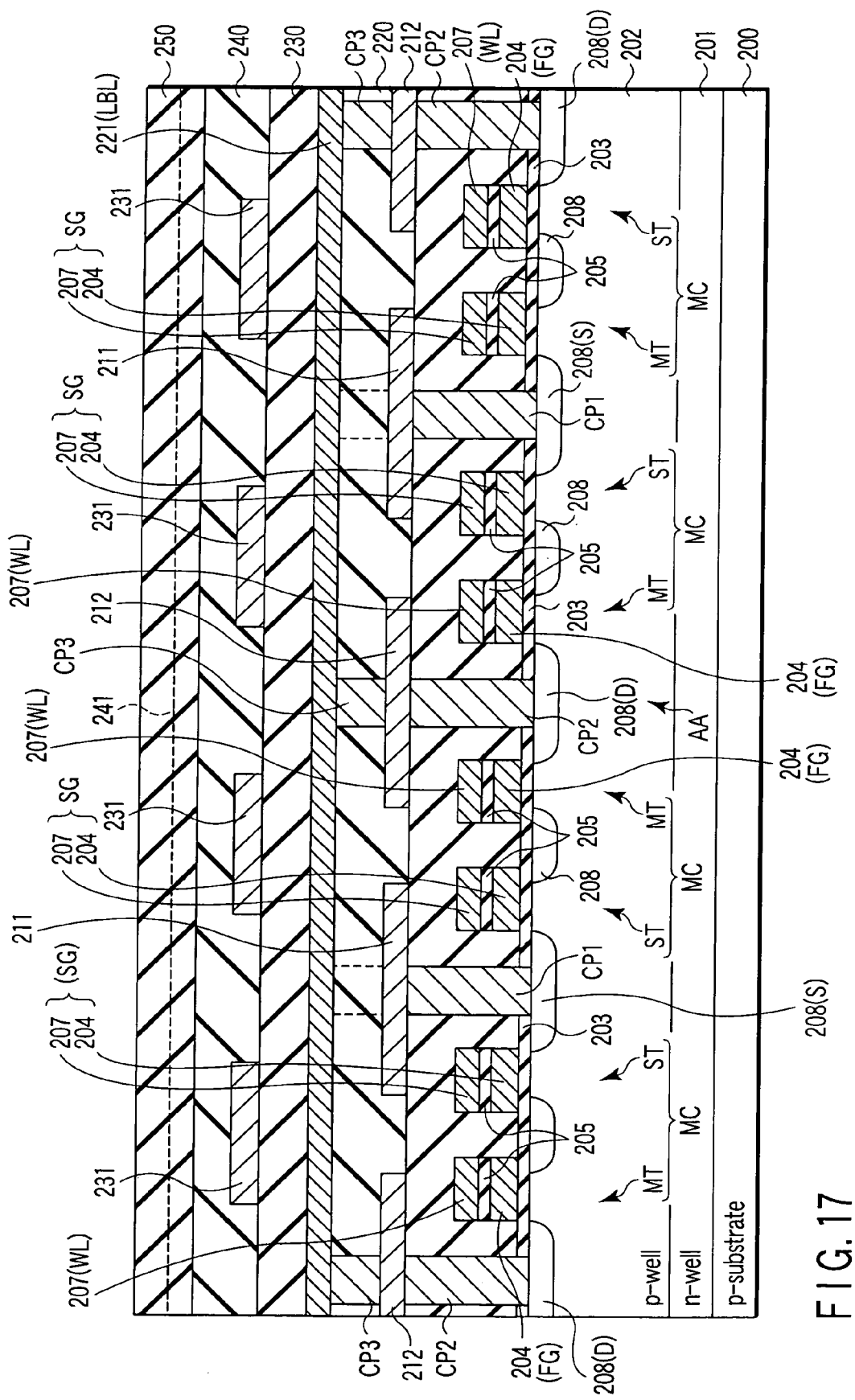
FIG. 17 is a sectional view of the memory cell array of a 2Tr flash memory included in the LSI of the fifth embodiment.

Next, a sectional structure of the memory cell array 110 of the flash memory with the above configuration will be explained using FIG. 17. FIG. 17 is a sectional view of the memory cell array 110 taken along a bit line.

As shown in FIG. 17, at the surface of the p-type semiconductor substrate 200, an n-well region 201 is formed. At the surface of the n-well region 201, a p-well region 202 is formed. In the p-well region 202, an element isolating region STI is formed. The region surrounded by the element isolating region STI is an element region AA. On the element region AA of the p-well region 202, a gate insulating film 203 is formed. On the gate insulating film 203, the gate electrodes of a memory cell transistor MT and a select transistor ST are formed. Each of the gate electrodes of the memory cell transistor MT and the select transistor ST includes a polysilicon layer 204 formed on the gate insulating film 203, an inter-gate insulating film 205 formed on the polysilicon layer 204, and a polysilicon layer 207 formed on the inter-gate insulating film 205. The inter-gate insulating film 205 is made of, for example, a silicon oxide film, or an ON film, NO film, or ONO film having a stacked structure of a silicon oxide film and a silicon nitride film.

In a memory cell transistor MT, the polysilicon layers 204, which are separated from each other between element regions AA adjacent to one another in the word line direction, function as floating gates (FG). On the other hand, the polysilicon layers 207, which are shared by adjacent element regions AA, function as control gates (or word lines WL).

In a select transistor ST, the polysilicon layers 204, 207 are shared by element regions AA adjacent to one another in the word line direction. Then, the polysilicon layers 204, 207 function as select gate lines SG. The polysilicon layers 207 may be made floating and only the polysilicon layers 204 may be caused to practically function as select gate lines.

At the surface of the p-well region 202 between adjacent gate electrodes, an impurity diffused layer 208 is formed. The impurity diffused layer 208 is shared by adjacent transistors.

A memory cell MC including a memory cell transistor MT and a select transistor ST is formed so as to have the following relationship. In adjacent memory cells MC, their select transistors ST or their memory cell transistors MT are adjacent to each other. The adjacent select transistors or memory cell transistors share the impurity diffused layer 208. Therefore, two adjacent memory cells MC, MC, when their select transistors ST are adjacent to each other, are arranged symmetrically with the impurity diffused layer (or source region) 208 shared by the two select transistors ST, ST. Conversely, when their memory cell transistors MT are adjacent to each other, two adjacent memory cells MC, MC are arranged symmetrically with the impurity diffused layer (or drain region) 208 shared by the two memory cell transistors MT, MT.

Then, on the p-well region 202, an interlayer insulating film 210 is formed so as to cover the memory cell transistor MT and select transistor ST. In the interlayer insulating film 210, a contact plug CP1 reaching the impurity diffused layer (or source region) 208 shared by two select transistors ST, ST is formed. On the interlayer insulating film 210, a metal wiring layer 211 connected to the contact plug CP1 is formed. The metal wiring layer 211 functions as a source line SL. Further in the interlayer film 210, a contact plug CP2 reaching the impurity diffused layer (or drain region) 208 shared by two memory cell transistors MT, MT is formed. On the interlayer insulating film 210, a metal wiring layer 212 connected to the contact plug CP2 is formed.

On the interlayer insulating film 210, an interlayer insulating film 220 is formed so as to cover the metal wiring layers 211, 212. In the interlayer insulating film 220, a contact plug CP3 reaching the metal wiring layer 212 is formed. On the interlayer insulating film 220, a metal wiring layer 221 connected commonly to a plurality of contact plugs CP3 is formed. The metal wiring layer 221 function as any one of the local bit lines LBL0 to LBL3. In the interlayer insulating film 220, a contact plug reaching the metal wiring layer 211 is formed (although not shown). Then, a metal wiring layer connecting these contact layers to one another is formed on the interlayer insulating film 220. This meal wiring layer also functions as a source line.

On the interlayer insulating film 220, an interlayer insulating film 230 is formed so as to cover the metal wiring layer 221. On the interlayer insulating film 230, metal wiring layers 231 are formed. The metal wiring layers 231, which are arranged at equal intervals, functions as shunt lines for select gate lines. On the interlayer insulating film 230, an interlayer insulating film 240 is formed so as to cover the metal wiring layers 231.

On the interlayer insulating film 240, a metal wiring layer 241 functioning as a write global bit line and a read global bit line is formed. In addition, an interlayer insulating film 250 is also formed.

Figure 18:
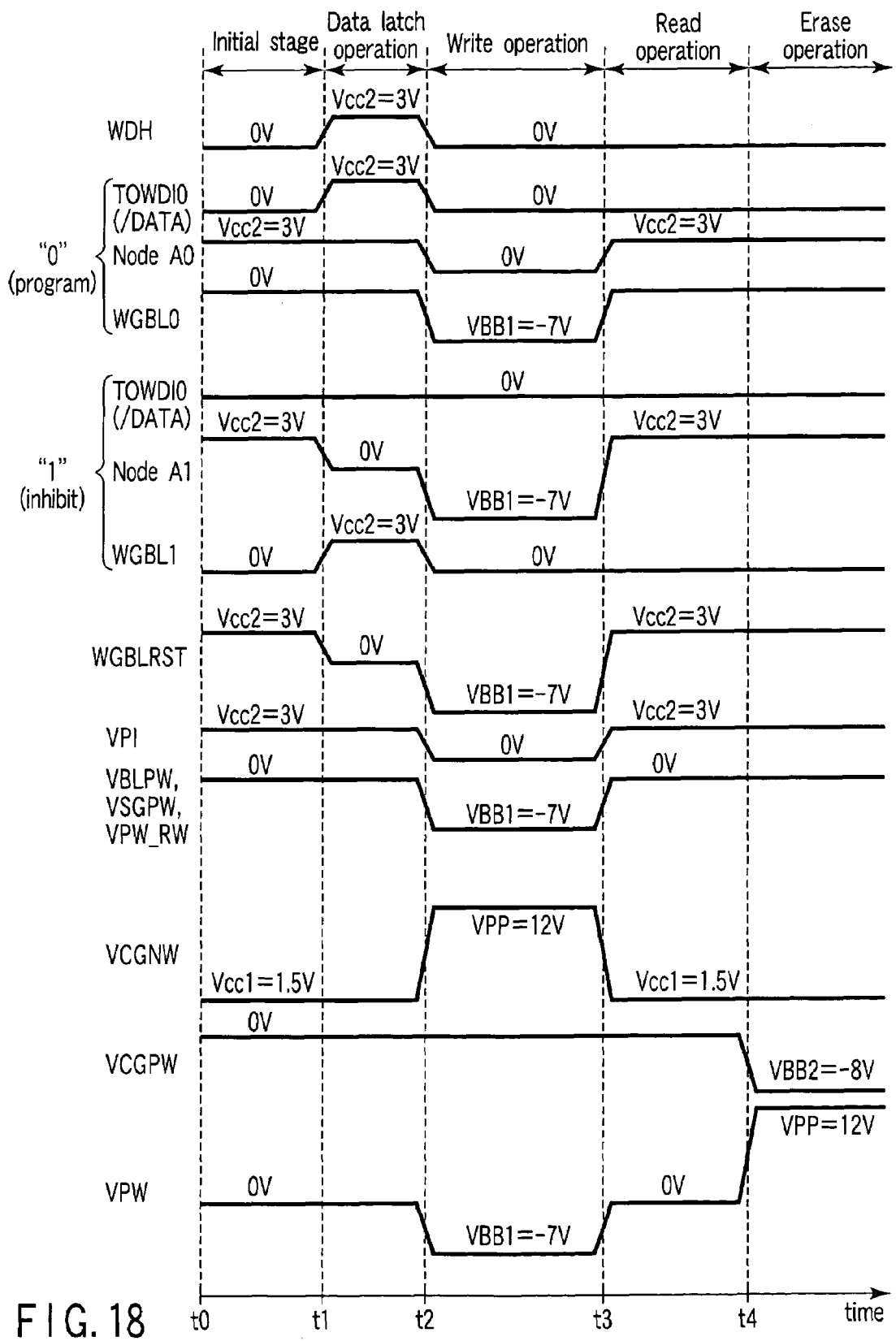
FIG. 18 is a timing chart of various signals in the operation of the 2Tr flash memory included in the LSI of the fifth embodiment.

Next, the operation of the 2Tr flash memory 102 configured as described above will be explained using FIG. 18. FIG. 18 is a timing chart of various signals and the voltages at various nodes. Hereinafter, a state where no electron is injected into the floating gate and the threshold voltage is negative is defined as a state where "1" data has been written. A state where electrons are injected into the floating gate and the threshold voltage is positive is defined as a state where "0" data has been written. To simplify explanation, a case where a memory cell array 110 has two write global bit lines WGBL0, WGBL1 and one read global bit line RGBL0 is used as an example.

<Initial Operation>

Figure 19:
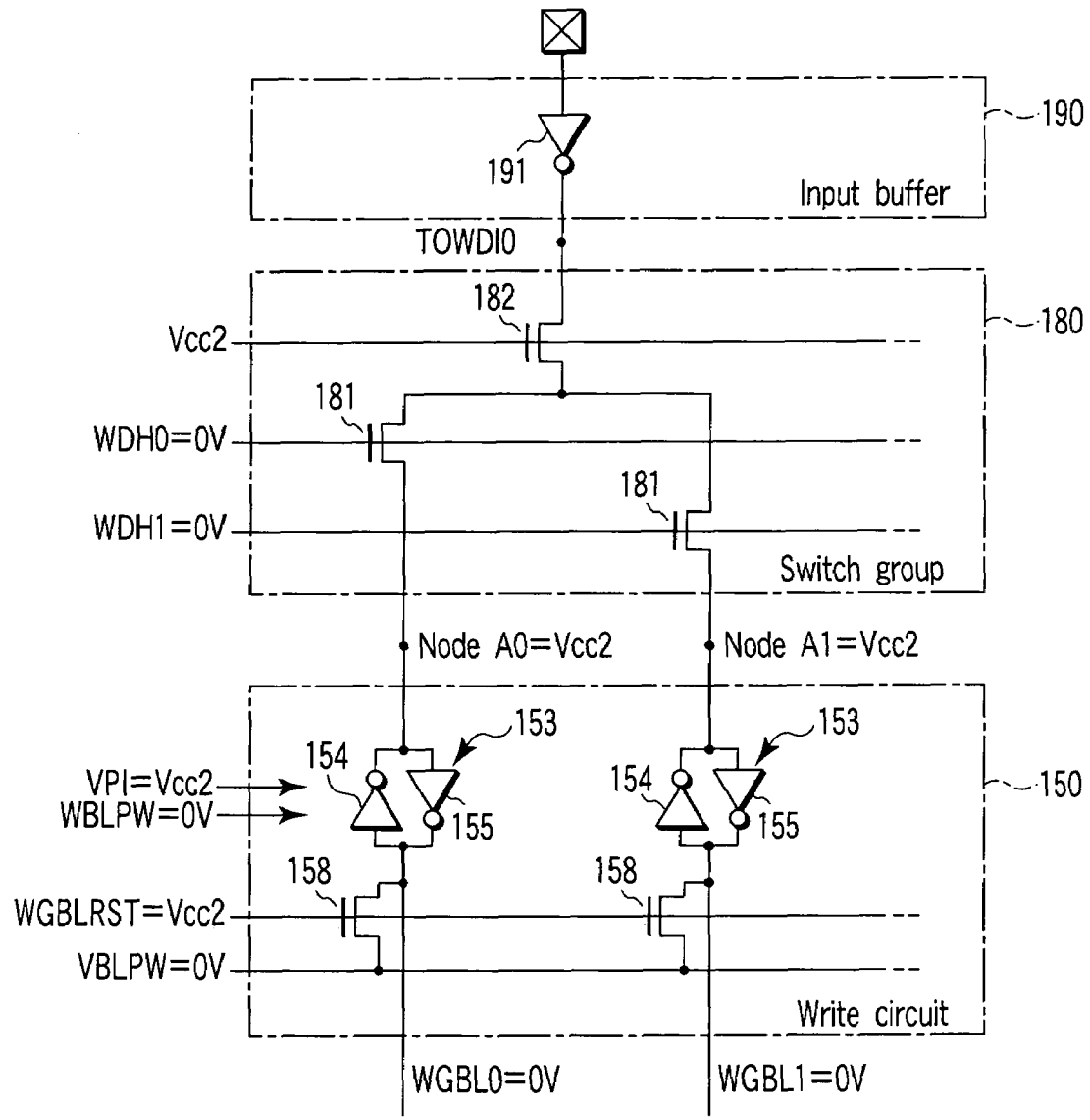
FIG. 19 is a circuit diagram of the write circuit, switch group, and input buffer of a 2Tr flash memory included in the LSI of the fifth embodiment, showing the initial state.

Using FIG. 19, an initial operation will be explained. An initial operation is the first operation to be performed in a write, a read, or an erase operation. In FIG. 19, an initial operation is carried out in the period between time t0 to time t1. FIG. 19 is a circuit diagram of the input buffer 190, switch group 180, and write circuit 150 corresponding to the write global bit lines WGBL0, WGBL1 in an initial operation.

Before the initial operation, the signals WDH0 and WDH1 are both set to the low (L) level (0 V), turning off the MOS transistors 181 in the switch group 180, which electrically separates the write circuit 150 from the input buffer 190. The write inhibit voltage VPI supplied as the high power supply voltage of the latch circuit 153 is set to Vcc2 and VBLPW is set to 0 V. Then, the signal WGBLRST is set to the high (H) level (Vcc2) and all of the write global bit lines WGBL0, WGBL1 are reset. That is, the MOS transistors 158 in the write circuit 150 are turned on, thereby allowing VBLPW node to apply 0 V to the write global bit lines WGBL0, WGBL1. As a result, the output nodes of all of the latch circuits 153 go to the low (L) level (0 V) and the input nodes (node A0, node A1) go to the high (H) level (Vcc2).

As described above, in the initial operation, the write global bit lines are set to 0 V and Vcc2 is applied to node A0 and node A1.

<Data Latch Operation>

Figure 20:
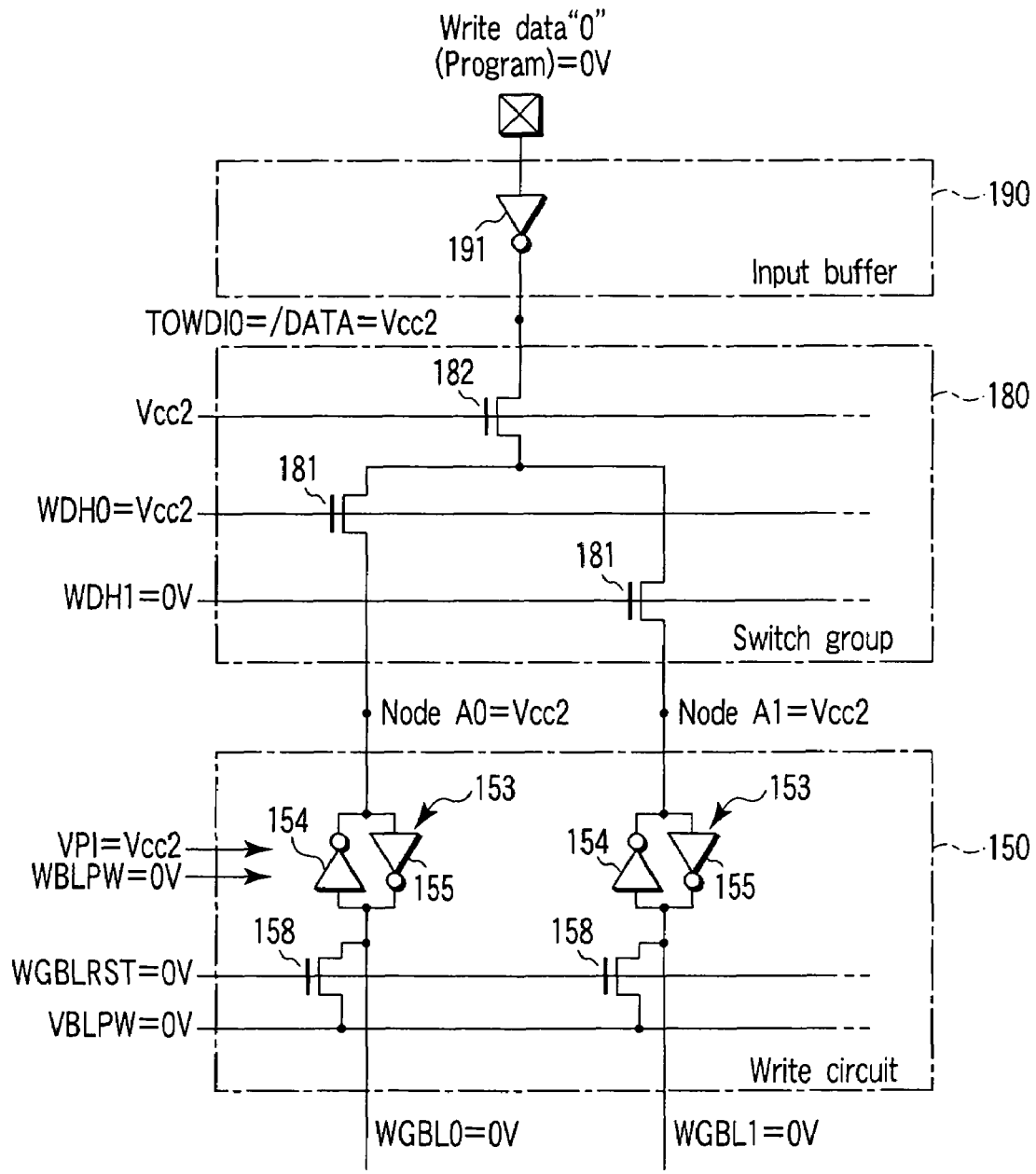
FIG. 20 is a circuit diagram of the write circuit, switch group, and input buffer of a 2Tr flash memory included in the LSI of the fifth embodiment, showing a data latch operation.
Figure 21:
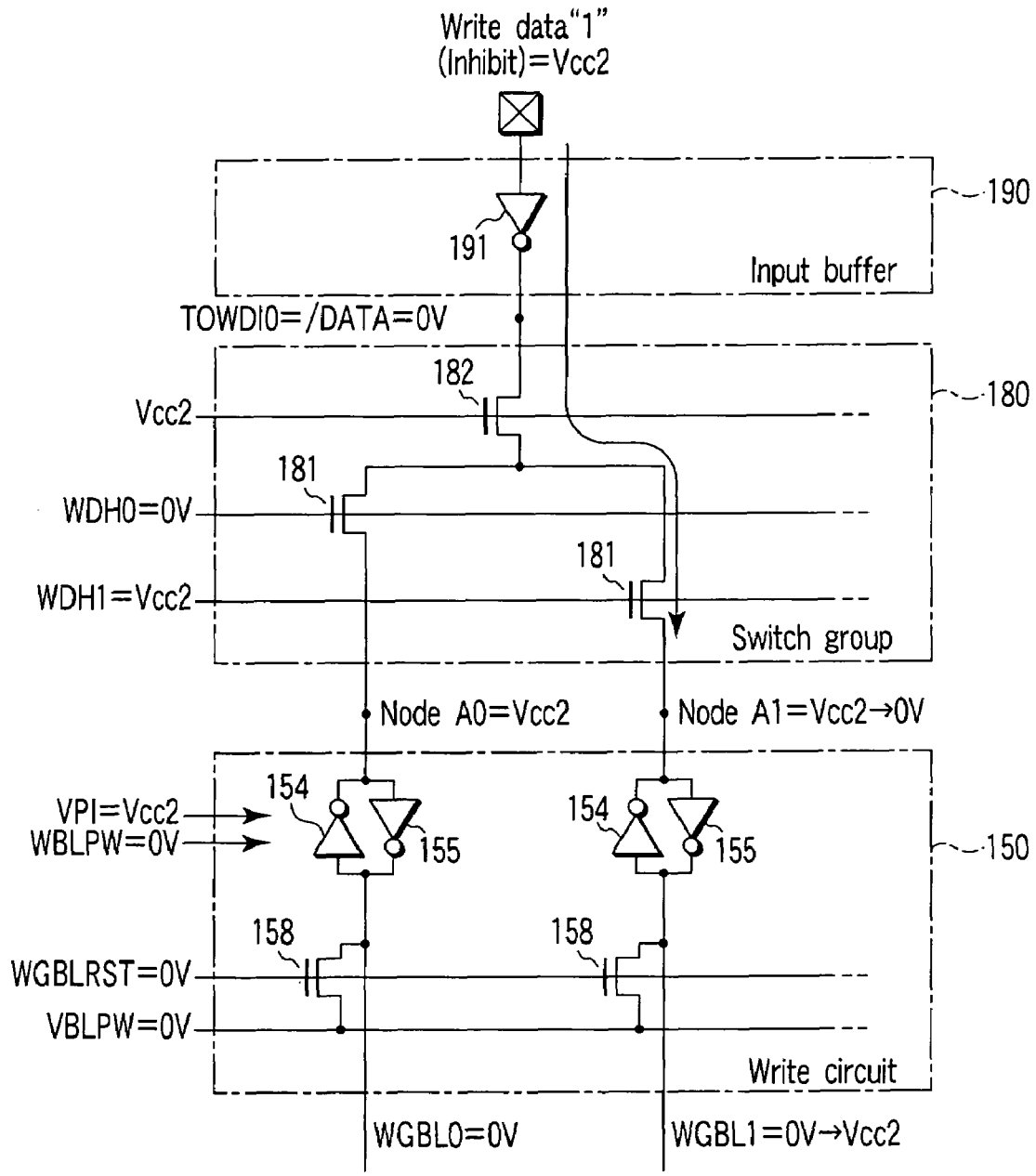
FIG. 21 is a circuit diagram of the write circuit, switch group, and input buffer of a 2Tr flash memory included in the LSI of the fifth embodiment, showing a data latch operation.

Next, using FIGS. 20 and 21, a data latch operation will be explained. A data latch operation is the operation of inputting the write data to each latch circuit 153 in a write operation. A data latch operation is carried out between time t1 to time t2 in FIG. 18. FIGS. 20 and 21 are circuit diagrams of the input buffer 190, switch group 180, and write circuit 150 in a data latch operation. FIG. 20 shows a case where "0" data has been inputted. FIG. 21 shows a case where "1" data has been inputted. Hereinafter, explanation will be given using a case where "0" data is written into the memory cells connected to write global bit line WGBL0 (that is, WGBL0 is selected) and "1" data is written into the memory cells connected to WGBL1 (that is, WGBL1 is unselected).

First, using FIG. 20, a case where "0" data is input will be explained. Before a data latch operation, the signal WGBL-RST is set to 0 V, thereby turning off the MOS transistor 158, which electrically separates write global bit lines WGBL0, WGBL1 from VBLPW node. To latch the data in the latch circuit 153 corresponding to write global bit line WGBL0, the signal WDH0 is set to the high (H) level (Vcc2), which turns on the MOS transistor 181 corresponding to write global bit line WGBL0. On the other hand, the MOS transistor 181 corresponding to write global bit line WGBL1 is turned off. Therefore, the input buffer 190 is electrically connected to the latch circuit 153 corresponding to write global bit line WGBL0.

Then, the CPU 101 inputs "0" data to the inverter of the input buffer 190. When "0" data is input, 0 V is applied to the input node of the inverter 191. The "0" data is inverted by the inverter 191. As a result, the potential at TOWDI0 node goes to Vcc2. Then, since Vcc2 has been applied to the gate of the MOS transistor 182, the MOS transistor 182 goes into the cutoff state. Therefore, the latch circuit 153 keeps holding the data given in the period between time t0 to time t1. That is, node A0 remains at Vcc2 and write global bit line WGBL0 remains at 0 V.

Next, using FIG. 21, a case where "1" data is input will be explained. What differs from the case where "0" data is input is that setting WDH0 to 0 V (WDH0=0V) and WDH1 to Vcc2 (WDH1=Vcc2) brings the MOS transistor 181 corresponding to write global bit line WGBL1 into the on state.

Then, the CPU 101 inputs "1" data to the input buffer. When "1" data is input, Vcc2 is applied to the input node of the inverter 191. Consequently, the potential at TOWDI0 node goes to 0 V. The potential at TOWDI0 node is input to the latch circuit 153 via the current path of the MOS transistor 181. As a result, the potential at node A1 is inverted from Vcc2 to 0 V, which inverts the potential on write global bit line WGBL1 from 0 V to Vcc2.

As described above, in the data latch operation, the data in the latch circuit corresponding to the memory cell into which "1" data is to be written is reversed from its initial state. That is, when "0" writing is done (or when electrons are injected), virtually no data is input from the outside. When "1" writing (or when no electron is injected=the memory is unselected), the data is taken in from the outside.

<Write Operation>

Figure 22:
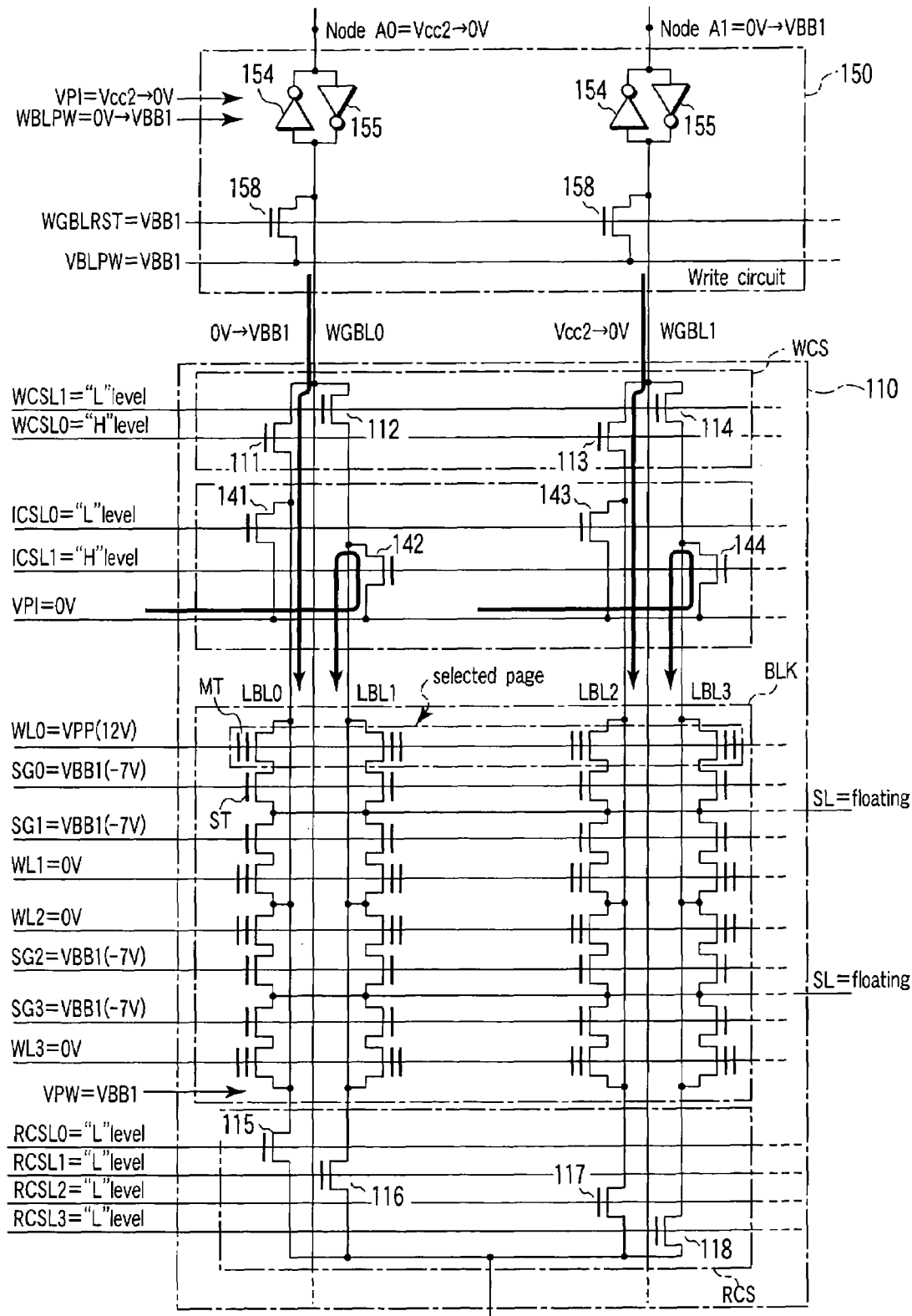
FIG. 22 is a circuit diagram of the write circuit and memory cell array of a 2Tr flash memory included in the LSI of the fifth embodiment, showing a write operation.

Next, using FIG. 22, a write operation will be explained. Data is written simultaneously into all of the memory cell blocks in a row. In each of the memory cell blocks, the data is written simultaneously into the memory cell connected to one of the local bit lines LBL0 and LBL1 and the memory cell connected to one of the local bit lines LBL2 and LBL3.

In FIG. 18, a write operation is carried in the period between time t2 and t3. FIG. 22 is a circuit diagram of a part of the memory cell array 110 and write circuit 150 in a write operation. In FIG. 22, it is assumed that data is written into the memory cell transistors MT connected to word line WL0 and local bit lines LBL0, LBL2 and that, of the memory cell transistors MT, "0" data is written into the ones connected to local bit line LBL0 and "1" data is written into the ones connected to local bit line LBL2. In other words, the memory cells connected to local bit line LBL0 are selected and the memory cells connected to local bit line LBL2 are unselected.

First, before a write operation, the signal WGBLRST is set to VBB1 (−7 V), turning off the MOS transistor 158. Then, the write inhibit voltage VPI changes from Vcc2 to 0 V and the potential at VBLPW node changes from 0 V to VBB1. The potential of VPI may be another negative potential instead of −7 V.

Then, the low power supply voltage of the inverters 154, 155 in the latch circuit 153 changes from 0 V to VBB1 and the high power supply voltage changes from Vcc2 to 0 V, with the result that the potentials at node A0 and node A1 change to 0 V and VBB1, respectively. The potentials on write global bit lines WGBL0, WGBL1 also change to VBB1 and 0 V, respectively.

Then, the write decoder 120 selects word line WL0 and applies the positive voltage VPP1 (12 V) to the selected word line WL0. In addition, the MOS transistor 125 is turned on, which allows the negative potential VBB1 (−7 V) at VSGPW node to be applied to all of the select gate lines SG0 to SG($4m$−1). In addition, the write decoder 20 applies the negative potential VBB1 to the substrate (or p-well region 202) in which memory cells has been formed. In a write operation, the signal ZISOG is set to the low (L) level, which electrically separates the row address decode circuit 131 of the select gate decoder 130 from the select gate lines.

The column decoder 140 selects write column select line WCSL0 from the two write column select lines connected to the write column selector WCS corresponding to the memory cell block BLK including the selected word line WL0. This turns on the MOS transistors 111, 113 in the write column selector WCS. As a result, write global bit line WGBL0 and local bit line LBL0 are electrically connected and write global bit line WGBL1 and local bit line LBL2 are electrically connected.

Furthermore, the column decoder 140 makes unselected all of the write column select lines connected to the write column selector WCS corresponding to the memory cell block BLK which does not include the selected word line WL0. Therefore, the MOS transistors 111 to 114 in the write column selector WCS corresponding to the memory cell block BLK not including the selected word line are turned off.

Furthermore, the column decoder 140 makes unselected all of the read column select lines RCSL0 to RCSL(4m−1). This turns off the MOS transistors 115 to 118 in all of the read column selectors RCS. Therefore, read global bit lines RGBL are electrically separated from local bit lines LBL0 to LBL3.

In addition, to turn on the MOS transistors 142, 144 connected to local bit lines LBL1, LBL3 made unselected, the column decoder 140 sets the write inhibit column select line ICSL1 to the high (H) level (Vcc2). Write inhibit column select line ICSL0 connected to the MOS transistors 141, 143 corresponding to the selected local bit lines LBL0, LBL2 is set to the low (L) level, which turns off the MOS transistors 141, 143. As a result, the write inhibit voltage VPI=0 V is applied to the unselected local bit lines LBL1, LBL3.

Consequently, the write voltage (VBB1) is applied from write global bit line WGBL0 Via the MOS transistor 111 in the write column selector WCS to local bit line LBL0 in the memory cell block BLK including the selected word line WL0. Moreover, the write inhibit voltage VPI (0 V) is applied from write global bit line WGBL1 via the MOS transistor 113 to local bit line LBL2 in the memory cell block BLK including the selected word line WL0.

As a result, in the memory cell transistor MT connected to write global bit lines WGBL1 and word line WL0, since the potential difference between the gate and channel is insufficient (VPP1−VPI=12 V), no electron is injected into the floating gate. Thus, the memory cell MC holds the negative threshold value. That is, "1" data is written. Furthermore, in the memory cell transistors MT connected to the unselected local bit lines LBL1, LBL3 and word line WL0, since VPI is applied to the channel, no electron is injected into the floating gate, which enables the memory cell MC to hold the negative threshold value. On the other hand, in the memory cell transistor MT connected to write global bit line WGBL0 and word line WL0, since the potential difference between the gate and channel is sufficient (VPP1−VBB1=19 V), electrons are injected into the floating gate by FN tunneling. As a result, the threshold value of the memory cell transistor MT changes to positive. That is, "0" data is written.

As described above, the data is written into one page of memory cell transistors simultaneously.

<Read Operation>

Figure 23:
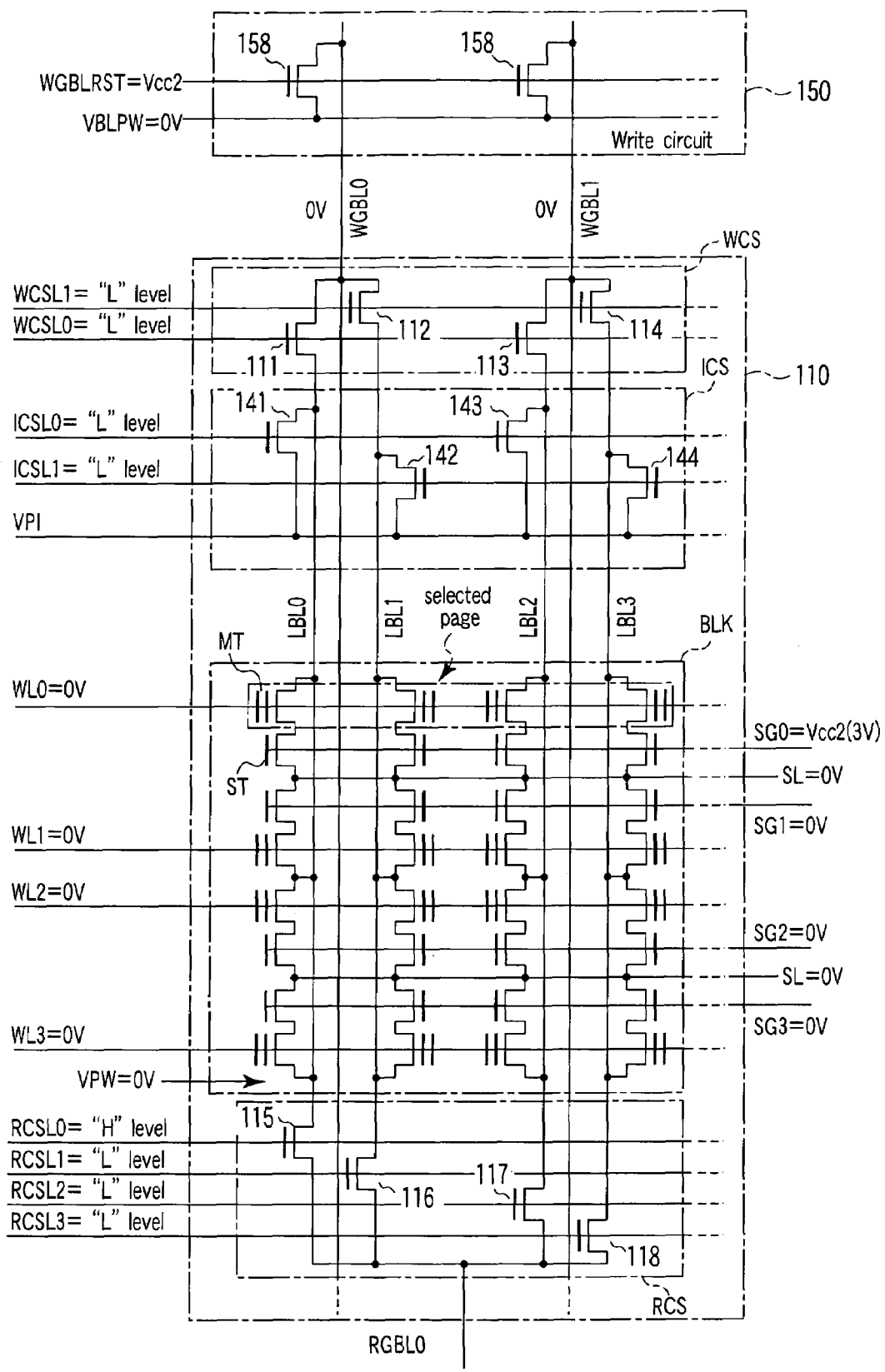
FIG. 23 is a circuit diagram of the write circuit and memory cell array of a 2Tr flash memory included in the LSI of the fifth embodiment, showing a read operation.
Figure 27:
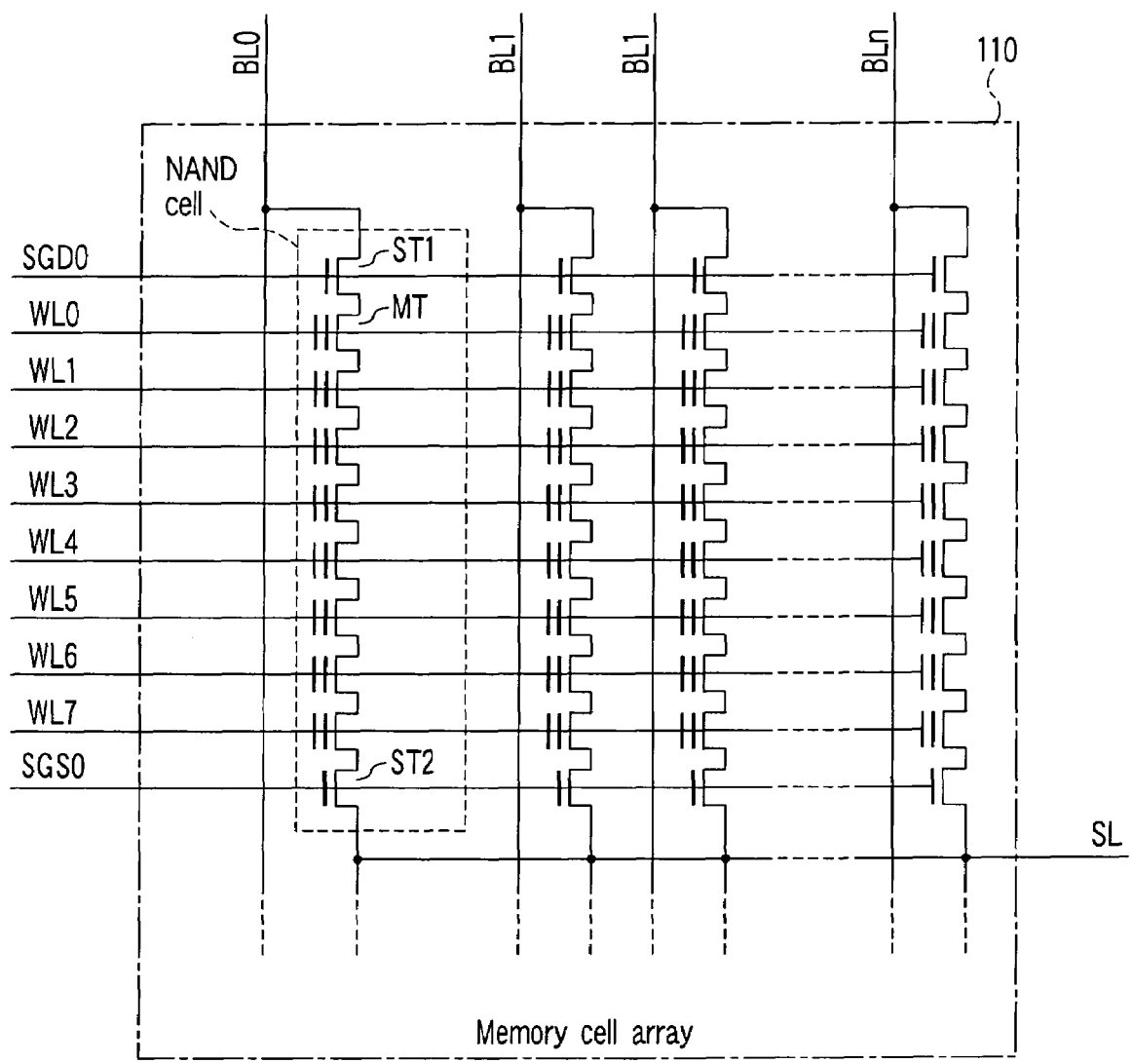
FIG. 27 is a circuit diagram of the memory cell array of a NAND flash memory included in an LSI according to a seventh embodiment of the present invention.

Next, using FIG. 23, a read operation will be explained. In FIG. 18, a read operation is carried out in the period between time t3 and time t4. FIG. 23 is a circuit diagram of the memory cell array 110, write circuit 150, and read unit 61 of the 2Tr flash memory 102. FIG. 27 shows a case where the data is read from the memory cell transistor MT connected to local bit line LBL0 and word line WL0. The data is read from one memory cell MC per memory cell block BLK. However, when there are a plurality of read global bit lines per memory cell block BLK, as many items of data as correspond to the read global bit lines are read out.

As shown in FIG. 23, first, the column decoder 140 selects read column select line RCSL0 from the four read column select lines RCSL0 to RCSL3 connected to the read column selector RCS corresponding to the memory cell block BLK including the selected select gate line SG0. This turns on the MOS transistor 115 in the read column selector RCS corresponding to the memory cell block BLK including the selected select gate line SG0.

Furthermore, the column decoder 140 makes all of the write column select lines WCSL0 to WCSL(2m−1) unselected, which turns off all of the four MOS transistors 111 to 114 in all of the write column select lines WCSL0 to WCSL(2m−1). Therefore, write global bit line WGBL is electrically separated from local bit lines LBL0 to LBL3.

When the signal WGBLRST is set to the high (H) level (Vcc2), this turns on the MOS transistor 158 in the write circuit 150. 0 V is applied to VBLPW node. Therefore, all of the write global bit lines WGBL0, WGBL1 are set to 0 V in the read operation.

Furthermore, the read global bit line RGBL0 is precharged. After the potential on the read global bit line has reached a specific precharge potential, the signal ZISOG is set to the high (H) level, turning on the MOS transistor 135. Then, the select gate decoder 130 selects select gate line SG0 (H level: Vcc2=3 V). Furthermore, the write decoder 20 makes all of the word lines WL0 to WL(4m−1) unselected (0 V) and sets the potential VPW at the p-well region 202 to 0 V. Moreover, the source line driver 170 sets the potential of the source line to 0 V. In the read operation, the signal WSG is set to the low (L) level, which electrically isolates the row address decode circuit 121 of the write decoder 120 from the select gate line.

Then, the select transistor ST connected to select gate line SG0 is turned on. As a result, if the data written in the memory cell transistor MT connected to the selected word line WL0 and selected local bit line LBL0 is "1", current flows from read global bit line RGBL0 to the source line. On the other hand, if the data written in the memory cell transistor MT is "0", no current flows.

Then, a change in the potential on the read global bit line is amplified by the sense amplifier of the read circuit 160. As described above, the read operation is carried out.

<Erase Operation>

Figure 24:
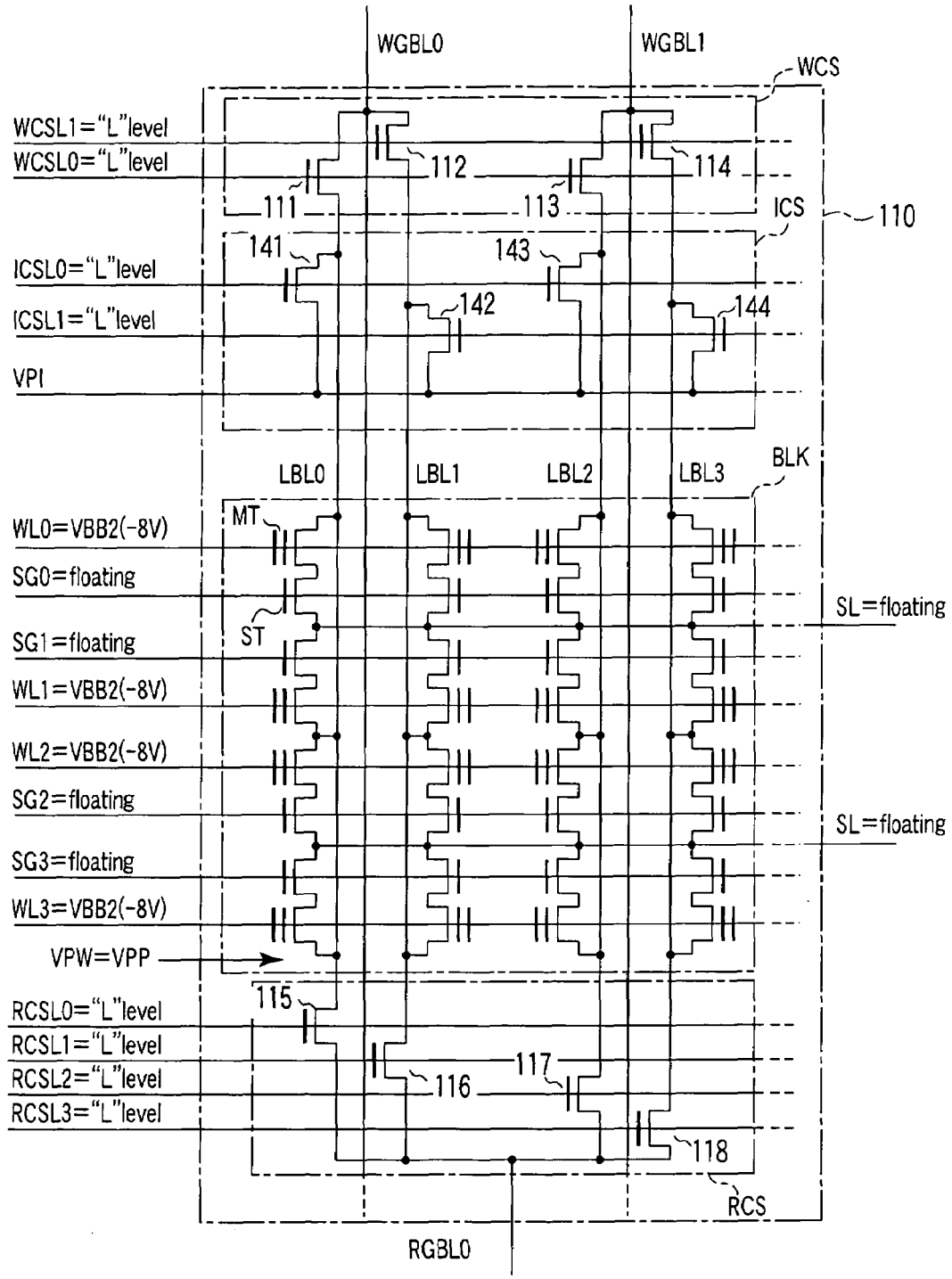
FIG. 24 is a circuit diagram of the write circuit and memory cell array of a 2Tr flash memory included in the LSI of the fifth embodiment, showing an erase operation.

Next, using FIG. 24, an erase operation will be explained. An erase operation is carried out at time t4 and later in FIG. 18. FIG. 24 is a circuit diagram of the memory cell array 110 in an erase operation. Data is erased from all of the memory cells MC sharing the p-well region 202 simultaneously. An erase operation is carried out by pulling electrons out of the floating gate by FN tunneling.

Before an erase operation, all of the MOS transistors 111 to 118 and 141 to 144 are turned off. Therefore, all of the write global bit lines WGBL0, WGBL1 are electrically isolated from the latch circuit 151 and read circuit 160 and from VBLPW node and VPI node and therefore go into the floating state.

Then, the write decoder 120 applies the negative voltage VBB2 to all of the word lines WL0 to WL(4m−1) in the selected block. In addition, the write decoder 120 applies the positive potential VPP to the substrate (p-well region 202) in which memory cells have been formed. In the erase operation, the signals ZISOG and WSG are set to the low (L) level, which separates the row address decode circuits 121, 131 electrically from the select gate lines.

As a result, electrons are extracted from the floating gates of the memory cell transistors of the memory cells MC into the substrate by FN tunneling, thereby erasing the data in all of the memory cells MC connected to word lines WL0 to WL(4m−1), which makes the threshold voltage negative. The potential on the select gate line rises to about VPP as a result of coupling with the p-well region 202. As described above, data is erased simultaneously.

As described above, the first to fourth embodiments can be applied to a system LSI in which a 2Tr flash memory and a CPU have been provided.

Next, a semiconductor integrated circuit device according to a sixth embodiment of the present invention will be explained. The sixth embodiment is such that a 3Tr-NAND flash memory is used as a semiconductor memory in place of the 2Tr flash memory in the fifth embodiment. Hereinafter, only what differs from the fifth embodiment will be explained.

A system LSI 100 according to the sixth embodiment is such that the memory cell array 110 is replaced with the configuration of FIG. 25 in the configuration of FIG. 13 explained in the fifth embodiment. FIG. 25 is a circuit diagram of the memory cell array 110 and write circuit 150 in the 3Tr-NAND flash memory 102 according to the sixth embodiment. The write decoder 120 and select gate decoder 130 may be replaced with a single row decoder.

As shown in FIG. 25, the memory cell array 110 has (m+1)×(n+1) memory cells MC arranged in a matrix.

Each of the memory cell MCs includes a memory cell transistor MT and select transistors ST1, ST2, which have their current paths connected in series with one another. The current path of the memory cell transistor MT is connected between the current paths of the select transistors ST1, ST2. The memory cell transistor MT has a stacked gate structure that includes a floating gate formed on a semiconductor substrate with a gate insulating film interposed therebetween and a control gate formed on the floating gate with an inter-gate insulating film interposed therebetween. Each of the select transistors ST1, ST2 has a multilayer gate structure that includes a first polysilicon layer formed on the semiconductor substrate with a gate insulating film interposed therebetween and a second polysilicon layer formed on the first polysilicon layer with an inter-gate insulating film interposed therebetween. The source region of the select transistor ST1 is connected to the drain region of the memory cell transistor MT. The source region of the memory cell transistor MT is connected to the drain region of the select transistor ST2. Memory cells MC adjoining each other in the column direction share the drain region of the select, transistor STI or the source region of the select transistor ST2.

The control gates of the memory cell transistors MT of the memory cells MC in a same row are connected commonly to any one of the word lines WL0 to WLm. The gates of the select transistors ST1 of the memory cells MC in a same row are connected commonly to any one of select gate lines SGD0 to SGDm. The gates of the select transistors ST2 of the memory cells in a same row are connected commonly to any one of select gate lines SGS0 to SGSm. The drain regions of the select transistors ST1 of the memory cell MCs in a same column are connected commonly to any one of bit lines BL0 to BLn. Bit lines BL0 to BLn are connected to the corresponding latch circuits 153, respectively. The latch circuits 153 operate using Vcc2 (3 V) and 0 V as power supply voltages. The source regions of the select transistors ST2 of the memory cells MC are connected commonly to a source line SL and further connected to the source line driver 170.

The row decoder decodes a row address signal, thereby producing a row address decode signal. Then, on the basis of the row address decode signal, the row decoder selects a word line and a select gate line.

Figure 26:
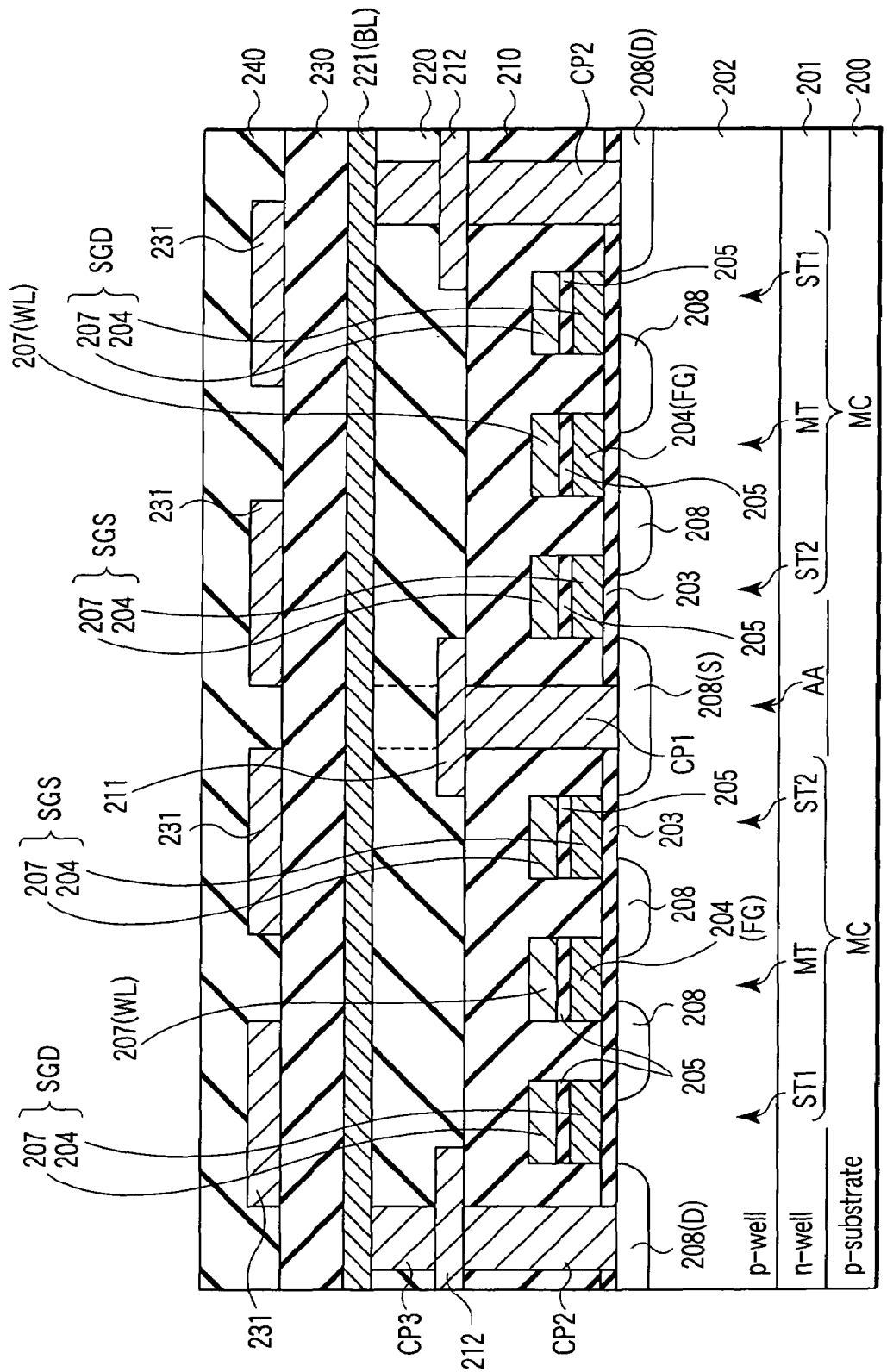
FIG. 26 is a sectional view of the memory cell array of a 3Tr-NAND flash memory included in the LSI of the sixth embodiment.

Next, using FIG. 26, a sectional structure of the memory cell array 110 configured as described above will be explained. FIG. 26 is a sectional view of the memory cell array 110 taken along a bit line. As shown in FIG. 26, at the surface of the p-type semiconductor substrate 200, an n-well region 201 is formed. At the surface of the n-well region 201, a p-well region 202 is formed. On the p-well region 202, the gate electrodes of a memory cell transistor MT and select transistors ST1, ST2 are formed via a gate insulating film 204. Each of the gate electrodes of the memory cell transistor MT and select transistors ST1, ST2 has a polysilicon layer 204 formed on the gate insulating film 204, an inter-gate insulating film 205 formed on the polysilicon layer 204, and a polysilicon layer 207 formed on the inter-gate insulating film 205 as explained in the fifth embodiment. Then, at the surface of the p-well region 202 located between adjacent gate electrodes, an impurity diffused layer 208 is formed. The impurity diffused layer 208 is shared by adjacent transistors.

On the p-well region 202, an interlayer insulating film 210 is formed so as to cover the memory cell transistor MT and select transistors ST1, ST2. In the interlayer insulating film 210, a contact plug CP1 reaching the impurity diffused layer (or source region) 208 shared by two select transistors ST2, ST2 is formed. On the interlayer insulating film 210, a metal wiring layer 211 connected to the contact plug CP1 is formed. The metal wiring layer 211 functions as a source line SL. Further in the interlayer film 210, a contact plug CP2 reaching the impurity diffused layer (or drain region) 208 shared by two select transistors ST1, ST1 is formed. On the interlayer insulating film 210, a metal wiring layer 212 connected to the contact plug CP2 is formed.

On the interlayer insulating film 210, an interlayer insulating film 220 is formed so as to cover the metal wiring layers 211, 212. In the interlayer insulating film 220, a contact plug CP3 reaching the metal wiring layer 212 is formed. On the interlayer insulating film 220, a metal wiring layer 221 connected commonly to a plurality of contact plugs CP3 is formed. The metal wiring layers 221 function as bit lines LBL0 to LBLn.

On the interlayer insulating film 220, an interlayer insulating film 230 is formed so as to cover the metal wiring layer 221. On the interlayer insulating film 230, a metal wiring layer 231 is formed. The metal wiring layer 231 functions as a shunt line for select gate lines SGS, SGD. The interconnections of the wiring layers 231 are arranged at equal intervals. On the interlayer insulating film 230, an interlayer insulating film 240 is formed so as to cover the metal wiring layer 231.

In the above configuration, on the basis of the voltage Vcc1, the voltage generator 103 generates a plurality of internal voltages VPP2 (=12 V), Vcc2 (=3 V) used in the 3Tr-NAND flash memory 102. Vcc1 is input as the first power supply V1 to the power-on reset circuit 104. VPP2 and Vcc2 are input as the second power supply V2 to the power-on reset circuit 104. Then, the power-on reset signal POR1 is asserted, which enables the CPU 101 and 3Tr-NAND flash memory 102 to operate.

Next, a semiconductor integrated circuit device according to a seventh embodiment of the present invention will be explained. The seventh embodiment is such that a NAND flash memory is used as a semiconductor memory instead of the 2Tr flash memory in the fifth embodiment. Therefore, the configuration of the seventh embodiment is such that the memory cell array 110 of the sixth embodiment is replaced with the configuration of FIG. 27. FIG. 27 is a circuit diagram of the memory cell array 110 included in the NAND flash memory.

As shown in FIG. 27, the memory cell array 110 has a plurality of NAND cells arranged in a matrix. Each of the NAND cells includes eight memory cell transistors MT and select transistors ST1, ST2. A memory cell transistor MT has a stacked-gate structure that includes a floating gate formed on a semiconductor substrate with a gate insulating film interposed therebetween and a control gate formed on the floating gate with an inter-gate insulating film interposed therebetween. The number of memory cell transistors MT is not limited to 8 and may be 16 or 32. The number is illustrative and not restrictive. The adjoining ones of the memory cell transistors MT share their source and drain. They are arranged in such a manner that their current paths are connected in series between the select transistors ST1, ST2. The drain region at one end of the series connection of the memory cell transistors MT is connected to the source region of the select transistor ST1. The source region at the other end of the series connection is connected to the drain region of the select transistor ST2. That is, a NAND cell is such that a plurality of memory cell transistors MT are used in a memory cell of a 3Tr-NAND flash memory.

The control gates of the memory cell transistors MT in a same row are connected commonly to any one of word lines WL0 to WLm. The gates of the select transistors ST1, ST2 of the memory cells in the same row are connected commonly to select gate lines SGD, SGS, respectively. The word lines WL0 to WLm and select gate lines SGS, SGD are connected to the row decoder. The drains of the select transistors STI in a same column in the memory cell array are connected commonly to any one of bit lines BL0 to BLn. The bit lines are then connected to the write circuit 150 and read circuit 160. The sources of the select transistors ST2 are connected commonly to a source line SL and then connected to a source line driver 170. Both of the select transistors ST1, ST2 are not necessarily needed. Only one of them may be used, provided that it can select a NAND cell.

Figure 28:
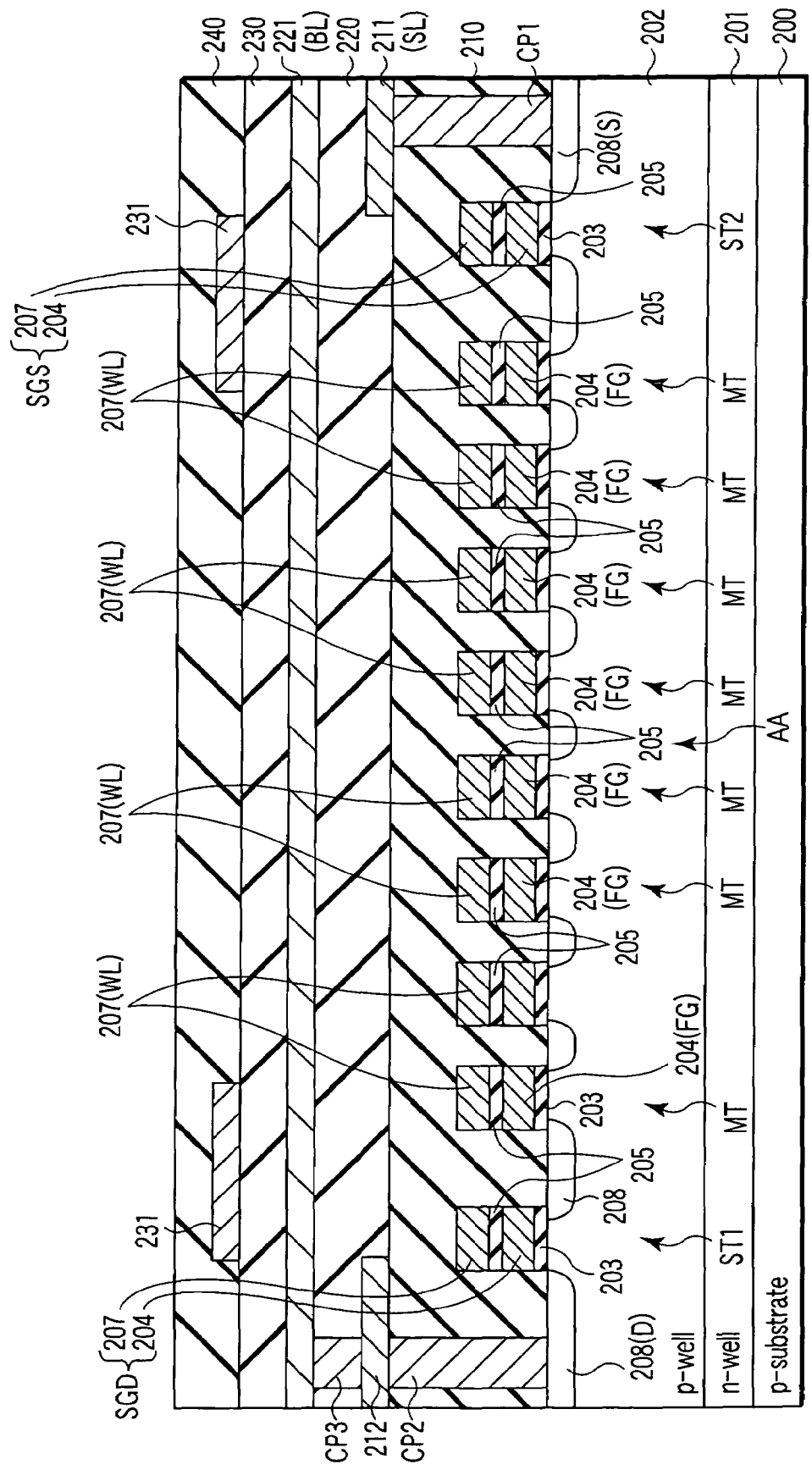
FIG. 28 is a sectional view of the memory cell array of a NAND flash memory included in the LSI of the seventh embodiment.

FIG. 28 is a sectional view of a NAND cell taken along a bit line. As shown in FIG. 28, at the surface of the p-type semiconductor substrate 200, an n-well region 201 is formed. At the surface of the n-well region 201, a p-well region 202 is formed. On the p-well region 202, a gate insulating film 203 is formed. On the gate insulating film 203, the gate electrodes of a memory cell transistor MT and select transistors ST1, ST2 are formed. Each of the gate electrodes of the memory cell transistor MT and select transistors ST1, ST2 includes a polysilicon layer 204 formed on the gate insulating film 203, an inter-gate insulating film 205 formed on the polysilicon layer 204, and a polysilicon layer 230 formed on the inter-gate insulating film 205. The inter-gate insulating film 205 is made of, for example, a silicon oxide film, or an ON film, NO film, or ONO film having a stacked structure of a silicon oxide film and a silicon nitride film. In a memory cell transistor MT, the polysilicon layers 204, which are separated from each other between adjacent element regions AA, function as floating gates (FG). The polysilicon layers 207 function as control gate (or word lines WL). In the select transistors ST1, ST2, the polysilicon layers 204, 207 function as select gate lines SGD, SGS. At the surface of the p-well region 202 located between adjacent gate electrodes, impurity diffused layers 208 functioning as source-drain regions are formed. An impurity diffused layer 208 is shared by adjacent transistors.

On the p-well region 202, an interlayer insulating film 210 is formed so as to cover the memory cell transistor MT and select transistors ST1, ST2. In the interlayer insulating film 210, a contact plug CP1 reaching the source region 208 of the select transistor ST2 is formed. On the interlayer insulating film 210, a metal wiring layer 211 connected to the contact plug CP1 is formed. The metal wiring layer 211 functions as a source line SL. Further in the interlayer insulating film 210, a contact plug CP2 reaching the drain region of the select transistor ST1 is formed. On the interlayer insulating film 210, a metal wiring layer 212 connected to the contact plug CP2 is formed.

On the interlayer insulating film 210, an interlayer insulating film 220 is formed so as to cover the metal wiring layers 211, 212. In the interlayer insulating film 220, a contact plug CP3 reaching the metal wiring layer 212 is formed. On the interlayer insulating film 220, a metal wiring layer 221 commonly connected to a plurality of contact plugs CP3 are formed. The metal wiring layer 221 functions as a bit line.

On the interlayer insulating film 220, an interlayer insulating film 230 is formed so as to cover the metal wiring layer 221. On the interlayer insulating film 230, metal wiring layers 231 are formed. The metal wiring layers 231, which are electrically connected to the polysilicon layers 204 of the select transistors ST2, ST1 in a region (not shown), function as shunt lines for the select gate lines SGS, SGD. Then, on the interlayer insulating film 230, an interlayer insulating film 240 is formed so as to cover the metal wiring layer 231.

Even to the NAND flash memory configured as described above, the first to fourth embodiments can be applied.

Figure 29:
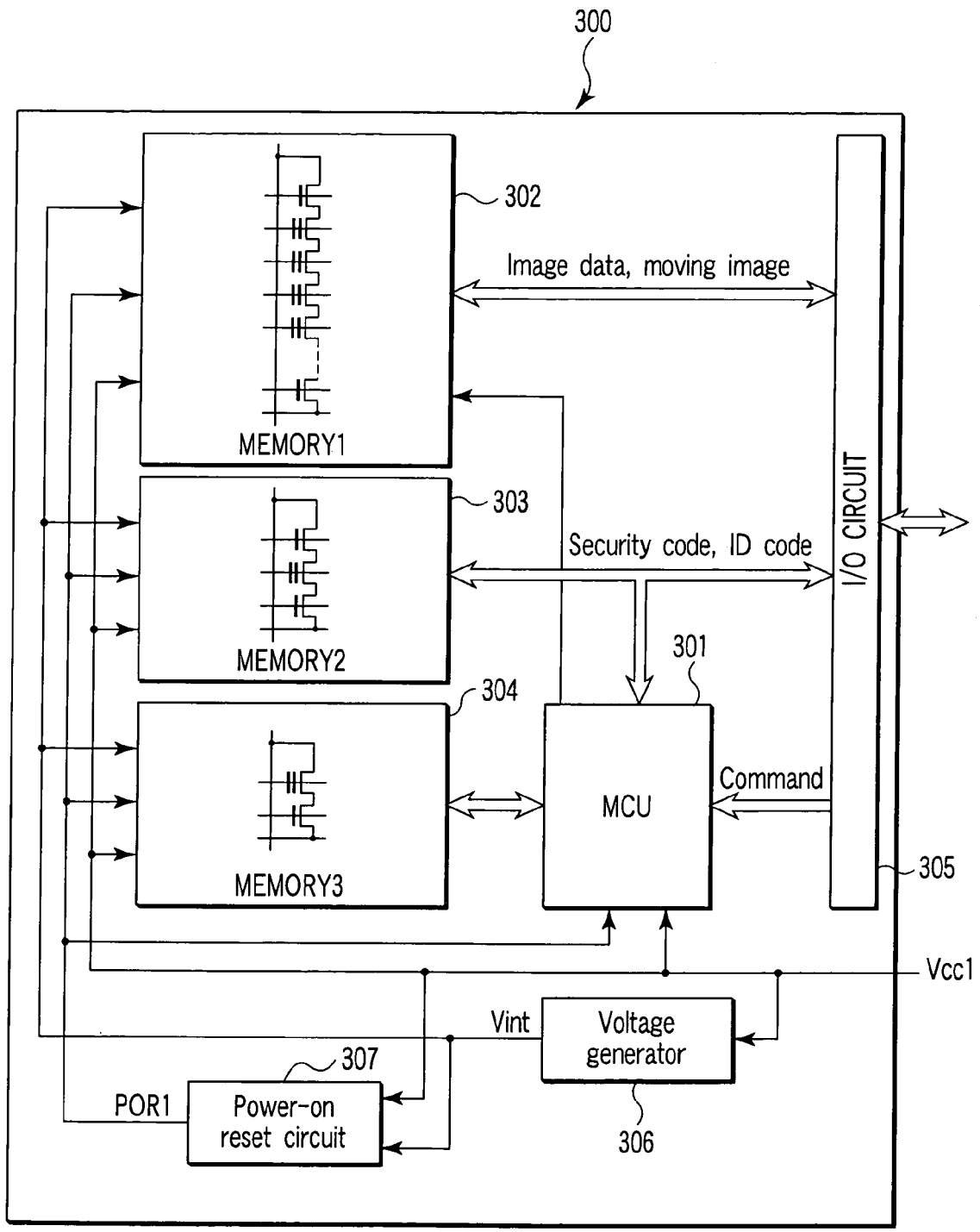
FIG. 29 is a block diagram of an LSI according to an eighth embodiment of the present invention.

Next, a semiconductor integrated circuit device according to an eighth embodiment of the present invention will be explained. The eighth embodiment is related to a system LSI in which a flash memory explained in each of the fifth to seventh embodiments is mounted on a single chip in each of the first to fourth embodiments. FIG. 29 is a block diagram of the system LSI according to the eighth embodiment.

As shown in FIG. 29, a system LSI 300 comprises an MCU 301, an I/O circuit 305, a voltage generator 306, a power-on reset circuit 307, a NAND flash memory 302, a 3Tr-NAND flash memory 303, and a 2Tr flash memory 304 formed on a single semiconductor substrate.

On the basis of the voltage Vcc1, the voltage generator 306 generates a plurality of internal voltages Vint used at the flash memories 302 to 304. The internal voltages Vint are, for example, VBB1, VBB2, VPP, VPP2, and Vcc2.

The power-on reset circuit 307 is the power-on reset circuit 4 explained in the first to fourth embodiments. Here, Vcc1 is input as the first power supply V1 and Vint is input as the second power supply V2.

The NAND flash memory 302 is used as a storage memory for storing image data or video data. The configuration of the NAND flash memory 302 is as explained in the seventh embodiment.

The 3Tr-NAND flash memory 302 holds an ID code for accessing the LSI 300 and a security code. The configuration of the 3Tr-NAND flash memory 303 is as explained in the sixth embodiment.

The 2Tr flash memory 304 holds program data for the MCU 301 to operate. The configuration of the 2Tr flash memory 304 is as explained in the fifth embodiment.

The MCU 301 does processing on the basis of the program read from the 2Tr flash memory 304, in response to various commands externally input. At this time, the MCU 301 accesses the 2Tr flash memory 304 directly without intervention of an SRAM (Static Random Access Memory) or the like. The processing done by the MCU 301 includes the compression or decompression of the data inputted to the NAND flash memory 302 and control of an external device. In addition, the MCU 301 reads specific data from the 3Tr-NAND flash memory 303, when the data held in the NAND flash memory 302 is accessed from the outside. Then, the MCU 301 checks the read-out data against the externally input ID code and security data. If they coincide with each other, the MCU 301 permits access to the NAND flash memory 302. When access to the NAND flash memory 302 is permitted, the data in the NAND flash memory 302 is accessed from the outside (host). Specifically, the MCU 301 triggers the NAND flash memory 302 in response to the command received from the outside, thereby reading (or writing) the data.

The I/O circuit 305 controls the exchange of signals between the LSI 300 and the outside.

In the system LSI 300 configured as described above, the memory cell transistors MT and select transistors ST1, ST2, ST included in the NAND flash memory 302, 3Tr-NAND flash memory 303, and 2Tr flash memory 304 can be formed in the same processes. That is, the individual MOS transistors are formed in the same oxidizing process, film-forming process, impurity implanting process, photolithographic etching process. As a result, the gate insulating film, inter-gate insulating film, the floating gates and control gates of the memory cell transistors MT, and the select gates of the select transistors are the same in the three flash memories 302 to 304. In such a manufacturing method, the memory cell arrays of the three flash memories can be formed by the number of processes required to form a single flash memory.

The 2Tr flash memory 302 uses a positive voltage (VPP1=12V) and a negative voltage (VBB1=−7V, VBB2=−8 V) in a write and an erase operation. Therefore, the gate insulating film of the MOS transistors used in the row decoder included in the 2Tr flash memory 304 may be thinner than that of the MOS transistors used in the row decoders included in the NAND flash memory 302 and 3Tr-NAND flash memory 303. Thus, the row decoder of the 2Tr flash memory can be made more compact. In addition, the operating speed of the row decoder can be made faster.

Furthermore, the program data for the MCU 301 to operate is stored in the 2Tr flash memory 304. Thus, the 2Tr flash memory 304 can operate at high speed as described above. The data can be read directly from the 2Tr flash memory 304 without the intervention of the MCU 301 or RAM. As a result, a RAM or the like is not needed, which helps simplify the configuration of the system LSI and improve the operating speed.

In addition, the 3Tr-NAND flash memory 303 holds an ID code and a security code. These code data are not so large in the amount of data, but are frequently changed and updated. Thus, the memory to hold the code data is required to operate at some high speed. In this respect, the 3Tr-NAND flash memory 303 uses a smaller erase unit than that in the NAND flash memory 302 and can rewrite the data in pages. Therefore, it can be said that the 3Tr-NAND flash memory 303 is the best semiconductor memory to hold the code data.

A conventional LSI including a NAND flash memory requires the following controller to prevent rewriting from concentrating on a specific block. The controller converts input addresses into physical addresses or, when a block malfunctions, determines the block to be faulty and performs control to prevent the faulty block from being used. In the eighth embodiment, however, such a controller is not needed. The reason is that the 2Tr flash memory 304 is caused to hold a firmware program to control the blocks in the NAND flash memory 302 and the MCU 301 is caused to perform such control. The MCU 301 performs the control in an interval of time between its original jobs (such as the process of controlling an external device or the process of computing the data input to the NAND flash memory 302). Of course, when the comparison of the capacity of the MCU 301 with the amount of work the MCU 301 has to process has shown that the amount of work has exceeded the capacity, a hardware sequencer or the like may be provided to control the NAND flash memory 302.

As described above, in the first to fourth embodiments, when the voltages used in the analog circuit and digital circuits are detected in the LSI using a plurality of power supplies, the detecting level is determined according to the operating state of the analog circuit. Specifically, the detecting level is caused to rise until the analog circuit in the check circuit has operated properly. At the time when the analog circuit starts to operate properly, the detecting level is maintained.

In an LSI including an analog circuit and a digital circuit, the power supply used for the digital circuit may also used for the analog circuit. When the voltage of the power supply rises after the power supply for the LSI is turned on, there may be a case where the voltage value is sufficient for the digital circuit but is insufficient for the analog circuit. In this case, the digital circuit operates properly, but the analog can operate erroneously.

However, in the above embodiments, the detecting level is caused to rise until the analog circuit has operated properly. Therefore, the power supply voltage can reach a sufficient value for the operation of not only the digital circuit but also the analog circuit. Then, thereafter, the power-on reset signal is output, which brings each circuit block in the LSI into the operable state. As a result, the occurrence of the erroneous operation of the analog circuit caused by an insufficient voltage level can be suppressed effectively.

Furthermore, as explained in the fifth to eighth embodiments, the present invention may be applied to a memory-embedded system LSI. While in the above embodiments, a flash memory has been used as a semiconductor memory, the present invention is not limited to this. For example, DRAM, MRAM, or ferroelectric memory may be used as a semiconductor memory.

The analog circuit 30 included in the check circuit 20 may be a part of the analog circuit 2 in FIG. 1. While the level shifter and dummy fuse block have been used as examples of the analog circuit 30, the invention is not limited to this. A circuit which carries out an analog circuit may be used. Since the level shifter and fuse block are circuit blocks which generally operate immediately after the power supply is turned on, it is desirable that they should be used as the analog circuit 30. The configuration of the check circuit 20 is not restricted to that of FIG. 3. Specifically, a configuration which can senses whether the analog circuit 30 is operating properly may be used. Furthermore, the configuration of the first detecting circuit is not restricted to that explained in each of the above embodiments. Specifically, a configuration which enables the detecting level to be changed by the control circuit 14 may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device which operates using a first power supply and a second power supply differing from the first power supply in voltage, the semiconductor integrated circuit device comprising:
   a first detecting circuit which detects that the first power supply has exceeded a specific voltage;
   a second detecting circuit which detects that the second power supply has exceeded a specific voltage; and
   a check circuit which checks the operating state of an analog circuit and outputs a control signal indicating whether the analog circuit is operating properly, the analog circuit carrying out an analog operation using the first power supply, a detecting level of the first detecting circuit being determined on the basis of the control signal and a power-on reset signal, the power-on reset signal being output according to the result of the detection at the first and second detecting circuits, the power-on reset signal indicating that the first and second power supplies have reached a specific value.

2. The semiconductor integrated circuit device according to claim 1, wherein the first detecting circuit includes a variable resistive element and determines the detecting level according to the resistance of the variable resistive element.

3. The semiconductor integrated circuit device according to claim 2, further comprising a shift register which shifts bits in the data held therein according to the result of the detection at the first detecting circuit, the resistance of the variable resistive element being set according to the data held in the shift register.

4. The semiconductor integrated circuit device according to claim 1, wherein the check circuit includes a level shifter and checks whether or not the output voltage of the level shifter is normal.

5. The semiconductor integrated circuit device according to claim 1, wherein the check circuit includes a fuse element which holds data and a read circuit which reads the data from the fuse element, and checks whether or not the operation of reading the data from the fuse element has been completed properly.

6. The semiconductor integrated circuit device according to claim 1, further comprising:
   a clock generating circuit which generates a clock on the basis of the result of the detection at the first and second detecting circuits;
   a holding circuit which holds the control signal as data in response to the control signal and the clock; and
   a detecting level control circuit which controls the detecting level of the first detecting circuit in response to the control signal,
   wherein, when the analog circuit is not operating properly, the holding circuit holds the control signal and the detecting level control circuit changes the detecting level of the first detecting circuit, and
   when the analog circuit is operating properly, the detecting level control circuit maintains the detecting level of the first detecting circuit on the basis of the data held in the holding circuit.

7. The semiconductor integrated circuit device according to claim 1, wherein the check circuit includes
   a first level shifter which uses the first power supply as an input signal,
   a second level shifter which uses the ground potential as an input signal,
   a first logic circuit which performs logical operations on the output signal of the first level shifter and the second power supply and, when they coincide with each other, outputs a high level,
   a second logic circuit which performs logical operations on the output signal of the second level shifter and the ground potential and, when they coincide with each other, outputs a high level, and
   a third logic circuit which, when the outputs of the first and second logic circuits are both at the high level, asserts the control signal and indicates that the analog circuit is operating properly.

8. The semiconductor integrated circuit device according to claim 1, wherein the analog circuit includes a nonvolatile semiconductor memory device which includes a plurality of memory cells each having a select transistor and a memory cell transistor connected in series, the nonvolatile semiconductor memory device using a positive potential and a negative potential as the second power supply.

9. The semiconductor integrated circuit device according to claim 1, further comprising:
   a clock generating circuit which generates a clock on the basis of the result of the detection at the first and second detecting circuits;
   a holding circuit which holds the control signal as data in response to the control signal and the clock; and
   a detecting level control circuit which controls the detecting level of the first detecting circuit in response to the control signal,
   wherein, when the analog circuit is not operating properly, the holding circuit holds the control signal and the detecting level control circuit changes the detecting level of the first detecting circuit, and
   when the analog circuit is operating properly, the detecting level control circuit maintains the detecting level of the first detecting circuit on the basis of the control signal.

* * * * *